(12) United States Patent
Shanjani et al.

(10) Patent No.: US 11,444,614 B2
(45) Date of Patent: Sep. 13, 2022

(54) METHODS AND DEVICES TO IMPROVE SWITCHING TIME BY BYPASSING GATE RESISTOR

(71) Applicant: pSemi Corporation, San Diego, CA (US)

(72) Inventors: Payman Shanjani, San Diego, CA (US); Eric S. Shapiro, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 16/951,838

(22) Filed: Nov. 18, 2020

(65) Prior Publication Data

US 2021/0143809 A1     May 13, 2021

Related U.S. Application Data

(63) Continuation of application No. 16/538,268, filed on Aug. 12, 2019, now Pat. No. 10,848,141, which is a continuation of application No. 15/376,471, filed on Dec. 12, 2016, now Pat. No. 10,396,772.

(51) Int. Cl.
*H03K 17/0412*     (2006.01)

(52) U.S. Cl.
CPC .............. *H03K 17/04123* (2013.01)

(58) Field of Classification Search
CPC ........................................ H03K 17/04123
See application file for complete search history.

(56) References Cited

U.S. PATENT DOCUMENTS

| 5,422,588 | A | 6/1995 | Wynne |
| 5,919,253 | A | 7/1999 | Schneider |
| 6,804,502 | B2 | 10/2004 | Burgener et al. |
| 7,173,466 | B2 | 2/2007 | Chiba et al. |
| 7,206,179 | B2 | 4/2007 | Miyamoto |
| 7,248,120 | B2 | 7/2007 | Burgener et al. |
| 7,868,683 | B2 | 1/2011 | Ilkov |
| 7,910,993 | B2 | 3/2011 | Brindle et al. |
| 8,461,903 | B1 * | 6/2013 | Granger-Jones ..... H03K 17/102 327/427 |
| 8,547,157 | B1 | 10/2013 | Mangold |
| 8,878,573 | B2 | 11/2014 | Sugahara |
| 8,922,268 | B2 | 12/2014 | Madan et al. |
| 9,209,854 | B2 | 12/2015 | Kim |

(Continued)

OTHER PUBLICATIONS

Hiltunen, Thomas J., Office Action received from the USPTO dated Apr. 19, 2018 for U.S. Appl. No. 15/376,471, 8 pgs.

(Continued)

*Primary Examiner* — Thomas J. Hiltunen
(74) *Attorney, Agent, or Firm* — Jaquez Land Greenhaus & McFarland LLP; Alessandro Steinfl, Esq.

(57) ABSTRACT

Implementing a series gate resistor in a switching circuit results in several performance improvements. Few examples are better insertion loss, lower breakdown voltage requirements and a lower frequency corner. These benefits come at the expense of a slower switching time. Methods and devices offering solutions to this problem are described.

(Continued)

Using a concept of bypassing the series gate resistor during transition time, a fast switching time can be achieved while the abovementioned performance improvements are maintained.

13 Claims, 22 Drawing Sheets

(56) References Cited

U.S. PATENT DOCUMENTS

| | | | |
|---|---|---|---|
| 9,406,695 B2 | 8/2016 | Shapiro et al. | |
| 9,705,492 B2 | 7/2017 | Choi | |
| 9,893,722 B2 | 2/2018 | Mokalla | |
| 9,966,946 B2 | 5/2018 | Bakalski | |
| 10,256,850 B2 * | 4/2019 | Wloczysiak | H04W 40/02 |
| 10,396,772 B2 | 8/2019 | Shanjani et al. | |
| 10,848,141 B2 | 11/2020 | Shanjani et al. | |
| 2015/0137246 A1 | 5/2015 | Shapiro et al. | |
| 2015/0288359 A1 | 10/2015 | Bakalski et al. | |
| 2018/0167062 A1 | 6/2018 | Shanjani et al. | |
| 2019/0149142 A1 | 5/2019 | Scott | |
| 2020/0044642 A1 | 2/2020 | Shanjani et al. | |

OTHER PUBLICATIONS

Hiltunen, Thomas J., Office Action received from the USPTO dated Sep. 19, 2018 for U.S. Appl. No. 15/376,471, 18 pgs.
Hiltunen, Thomas J., Final Office Action received from the USPTO dated Feb. 7, 2019 for U.S. Appl. No. 15/376,471, 16 pgs.
Hiltunen, Thomas J., Notice of Allowance received from the USPTO dated Apr. 11, 2019 for U.S. Appl. No. 15/376,471, 8 pgs.
PSemi Corporation, Response filed in the USPTO dated Dec. 17, 2018 for U.S. Appl. No. 15/376,471, 11 pgs.
PSemi Corporation, Response filed in the USPTO dated Jul. 18, 2018 for U.S. Appl. No. 15/376,471, 4 pgs.
PSemi Corporation, Response filed in the USPTO dated Mar. 26, 2019 for U.S. Appl. No. 15/376,471, 7 pgs.
Hiltunen, Thomas J., Office Action received from the USPTO dated Jan. 3, 2020 for U.S. Appl. No. 16/538,268, 12 pgs.
Hiltunen, Thomas J., Notice of Allowance received from the USPTO dated Jul. 21, 2020 for U.S. Appl. No. 16/538,268, 8 pgs.
PSemi Corporation, Response filed in the USPTO dated Jun. 30, 2020 for U.S. Appl. No. 16/538,268, 11 pgs.

\* cited by examiner

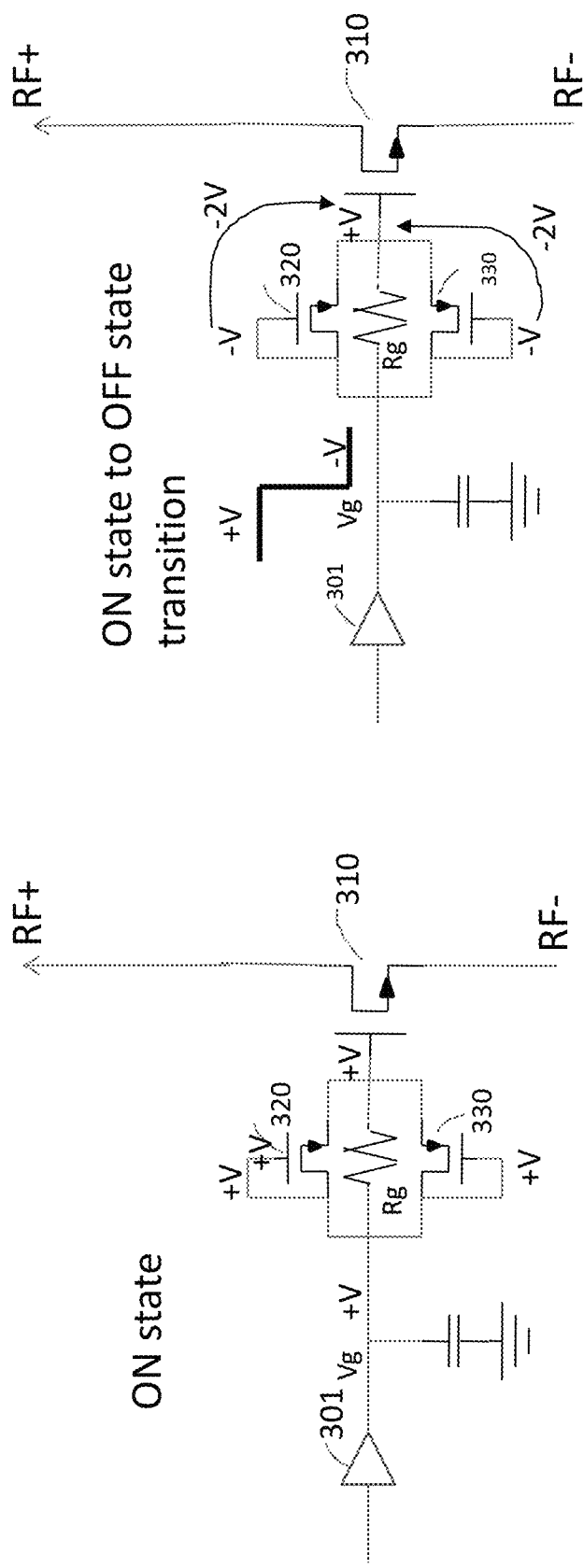

METHODS AND DEVICES TO IMPROVE SWITCHING TIME BY BYPASSING GATE RESISTOR

CROSS REFERENCE TO RELATED APPLICATIONS—CLAIM OF PRIORITY

This application is a continuation of co-pending and commonly assigned U.S. application Ser. No. 16/538,268, filed Aug. 12, 2019 and entitled "Methods and Devices to Improve Switching Time by Bypassing Gate Resistor", which is incorporated herein by reference in its entirety. application Ser. No. 16/538,268 is a continuation of commonly assigned U.S. application Ser. No. 15/376,471, filed Dec. 12, 2016 and entitled "Methods and Devices to Improve Switching Time by Bypassing Gate Resistor", now U.S. Pat. No. 10,396,772 issued Aug. 27, 2019, which is incorporated herein by reference in its entirety.

The present application may be related to patents U.S. Pat. No. 6,804,502, issued on Oct. 12, 2004 and entitled "Switch circuit and method of switching Radio Frequency signals", U.S. Pat. No. 7,910,993, issued on Mar. 22, 2011 and entitled "Method and apparatus used in improving linearity of MOSFET's using an accumulated charge sink", and U.S. Pat. No. 7,248,120, issued on Jul. 24, 2007 and entitled " Stacked transistor method and apparatus", all of which are incorporated herein by reference in their entirety. This application may also be related to U.S. patent application Ser. No. 14/521,378, filed on Oct. 22, 2014 and entitled "Circuit and Method for Improving ESD Tolerance and Switching Speed" and Ser. No. 14/521,331, filed on Oct. 22, 2014 and entitled "Floating Body Contact Circuit Method for Improving ESD Performance and Switching Speed", now abandoned, all of which are also incorporated herein by reference in their entirety.

TECHNICAL FIELD

The present disclosure relates to integrated circuit devices, and more particularly to methods and apparatus for reducing the switching time by bypassing gate resistor of switching devices.

BACKGROUND

FIG. 1A shows a diagram of a known FET switch with a gate resistor. It is well known to the person skilled in the art that using larger resistors in such switches has several advantages such as improved linearity and improved insertion loss. FET switches implementing larger gate resistors can handle larger voltage swings during normal operations. Moreover, integrated circuits using such switches with large gate resistor are able to maintain their RF performance in lower frequencies. However, such designs suffer from drawbacks such as large switching time as well as requiring a larger die area. Referring to the large switching time and by way of example, as shown in FIG. 1B, when the FET switch is in transition from the OFF to the ON state, the gate source equivalent capacitance, $C_{gs}$, is being charged by a current $110'$ flowing through a series resistance $R_g$. The transition time to the ON state is determined by the product $R_gC_{gs}$ of the series circuit. The larger is the series resistance $R_g$, the slower is the switching time. In integrated circuits implementing such switches, it is highly desirable to keep the benefits of having large gate resistors and at the same time, maintaining a fast switching speed. The methods and devices of the present disclosure offer solutions to the problem described.

SUMMARY

According to a first aspect of the present disclosure, a switching circuit is provided, comprising: a first node; a second node; a main FET switch; a gate resistor; a bypass switch, and wherein: a drain of the main FET switch is connected to the first node and a source of the main FET switch is coupled to the second node; the bypass switch is coupled across the gate resistor; and the gate resistor couples a control voltage to a gate of a main switch.

According to a second aspect of the present disclosure, a switching circuit is provided, comprising: a first node; a second node; a main FET switch; a series configuration of a first gate resistor and a second gate resistor; a bypass n-channel FET switch; a bypass p-channel FET switch; wherein: a drain of the main FET switch is connected to the first node and a source of the main FET switch is coupled to the second node; a control voltage is coupled through the first and the second gate resistors to a gate of the main switch; drains of the n-channel and the p-channel FETs are connected together; sources of the n-channel and the p-channel FETs are connected together; drains of the n-channel and the p-channel FETs are connected to gates of the n-channel and the p-channel FETs respectively, and the first gate resistor is coupled across the drains and sources of the n-channel and the p-channel FETs; wherein: the control voltage is configured to transition the main switch from an OFF to an ON state and vice versa; the n-channel FET is configured to be open when the main FET switch is in the OFF or the ON state and to be closed when the main FET switch is transitioning from the OFF to the ON state, thereby bypassing the first gate resistor, and the p-channel FET is configured to be open when the main switch is in the OFF or the ON state and to be closed when the main FET switch is transitioning from the ON to the OFF state, thereby by passing the first gate resistor.

According to a third aspect of the present disclosure, a switching circuit is provided, comprising: a first node; a second node; a first terminal; a second terminal; a main FET switch stack, and a bypass FET switch stack; wherein: the main FET switch stack comprises: a series arrangement of a plurality of main FET switches coupled between the first node and the second node, and a plurality of main gate resistors, the plurality of the main gate resistors connecting the second terminal to corresponding gates of the plurality of the main FET switches; the bypass FET switch stack comprises: a series arrangement of a plurality of first bypass FET switches; a series arrangement of a plurality of second bypass FET switches; a plurality of first bypass gate resistors; the plurality of the first bypass gate resistors connecting corresponding gates of the plurality of the first bypass FET switches to the first terminal; a plurality of second bypass gate resistors; the plurality of the second bypass gate resistors connecting corresponding gates of the plurality of the second bypass FET switches to the first terminal, and a through resistor; the through resistor connecting the first terminal to the second terminal; wherein: drains and sources of the first bypass FET switches are connected to corresponding drains and sources of the second bypass FET switches respectively; the drains of the bypass FET switches closest to the first terminal and farthest from the second terminal are connected to the first terminal; the sources of the bypass FET switches closest to the second terminal and farthest from the first terminal are connected to the second terminal; wherein: a supply voltage applied to the first terminal is configured to transition the plurality of the main FET switches from an OFF to an ON state and vice versa; the plurality of the first bypass FET switches are configured to be open when the plurality of the main FET switches are in the OFF or the ON state and to be closed when the plurality of the main FET switch is transitioning from the OFF to the ON state, and the second bypass switch is configured to be open when the main switch is in the OFF or the ON state and to be closed when the main switch is transitioning from the ON to the OFF state.

According to a fourth aspect of the present disclosure, a switching circuit is provided, comprising: a first node; a second node; a first terminal; a second terminal; a main FET switch stack, wherein: the main FET switch stack comprises: a series arrangement of a plurality of main FET switches coupled between the first node and the second node, and a plurality of main gate resistors, the plurality of the main gate resistors connecting the second terminal to corresponding gates of the plurality of the main FET switches; the bypass FET switch stack comprises: a series arrangement of a plurality of first bypass FET switches; a series arrangement of a plurality of second bypass FET switches; a plurality of first bypass gate resistors; the plurality of the first bypass gate resistors connecting corresponding gates of the plurality of the first bypass FET switches to the first terminal; a plurality of second bypass gate resistors; the plurality of the second bypass gate resistors connecting corresponding gates of the plurality of the second bypass FET switches to the first terminal, and a plurality of drain-source resistances, the plurality of the drain-source resistors being coupled across the corresponding drains and sources of the plurality of the first and the second bypass FET switches; wherein: drains and sources of the first bypass FET switches are connected to corresponding drains and sources of the second bypass FET switches respectively; the drains of the bypass FET switches closest to the first terminal and farthest from the second terminal are connected to the first terminal; the sources of the bypass FET switches closest to the second terminal and farthest from the first terminal are connected to the second terminal; wherein: a supply voltage applied to the first terminal is configured to transition the plurality of the main FET switches from an OFF to an ON state and vice versa; the plurality of the first bypass FET switches are configured to be open when the plurality of the main FET switches are in the OFF or the ON state and to be closed when the plurality of the main FET switch is transitioning from the OFF to the ON state, and the second bypass switch is configured to be open when the main switch is in the OFF or the ON state and to be closed when the main switch is transitioning from the ON to the OFF state.

According to a fifth aspect of the present disclosure, a switching circuit is provided, comprising: a first node; a second node; a main FET switch stack; a bypass switching block, and an input terminal; wherein: the main FET switch stack comprises: a series arrangement of a plurality of main FET switches coupled between the first node and the second node, wherein gates of the plurality of the main FET switches are connected together; the bypass switching block comprises a common switch coupled across a common gate resistor; the common gate resistor connects the input terminal to the gates of the plurality of the main FET switches, and wherein: the control voltage is applied to the input terminal and is configured to transition the plurality of the main FET switches from an OFF to an ON state and vice versa, and the common switch is configured to be open when the plurality of the main FET switches are in the OFF or the ON state and to be closed when the plurality of the main FET switches are transitioning from the OFF to the ON state and vice versa, thereby bypassing the common gate resistor.

According to a sixth aspect of the present disclosure, a switching circuit is provided, comprising: a first node; a second node; an input terminal, and a main switch stack; the main switch stack comprising: a series arrangement of a plurality of main FET switches coupled between the first node and the second node, and a plurality of main bypass switch blocks; wherein: each of the plurality of the main bypass switch blocks comprises a bypass switch, the bypass switch coupling across a main gate resistor, the main gate resistors connecting at one end together and to the input terminal and at another end to corresponding gates of the plurality of the main FET switches, and wherein: a control voltage applied to the input terminal is configured to transition the plurality of the main FET switches from an OFF to an ON state and vice versa, and the bypass switches are configured to be open when the plurality of the main FET switches are in the OFF or the ON state and to be closed when the plurality of the main switches are transitioning from the OFF to the ON state and vice versa, thereby bypassing the main gate resistors.

According to a seventh aspect of the present disclosure, a switching circuit is provided, comprising: a first node; a second node; an input terminal; an output terminal; a main switch stack, the main switch stack comprising: a series arrangement of a plurality of main FET switches coupled between the first node and the second node; series arrangements of a plurality of main bypass switch blocks and a plurality of corresponding main series resistors; a bypass switch block, and a common series resistor; wherein: the plurality of the main bypass switch blocks comprises a plurality of corresponding bypass switches and a plurality of corresponding main gate resistors, the plurality of the main bypass switches being coupled across the corresponding plurality of the main gate resistors; the series arrangements of the plurality of the main bypass switch blocks and the plurality of the corresponding main resistors couple the output terminal to corresponding gates of the plurality of the main FET switches; the bypass switch block comprises a common switch coupled across a gate series resistor, and the input terminal is connected to the output terminal via a series arrangement of the bypass switch block with the common series resistor; wherein: a control voltage applied to the input terminal is configured to transition the plurality of the main FET switches from an OFF to an ON state and vice versa, and the plurality of the bypass switches and the common switch are configured to be open when the plurality of the main FET switches are in the OFF or the ON state and to be closed when the plurality of the main switches are transitioning from the OFF to the ON state and vice versa, thereby bypassing the plurality of the main gate resistors and the gate series resistors respectively.

According to an eighth aspect of the present disclosure, a method for digitally tuning a capacitor in an integrated circuit is disclosed, providing: providing a first node; providing a second node; providing a main FET switch; providing a gate resistor; and providing a bypass switch; connecting a drain of the main FETs to first node and coupling a source of the main FET switch to the second node; coupling the bypass switch across the gate resistor; coupling the bypass switch across the gate resistor; coupling a control voltage to a gate of the main switch via the gate resistor; transitioning the main switch from an OFF to an ON state and vice versa by the control voltage, and opening the bypass switch when the main switch is in the OFF or the ON state and closing the bypass switch when the main switch is transitioning from the OFF state to the ON state and vice versa, thereby bypassing the gate resistance.

According to a ninth aspect of the present disclosure, a method for digitally tuning a capacitor in an integrated circuit is disclosed, providing: providing a first node; providing a second node; providing a main FET switch; providing a series configuration of a first gate resistor and a second gate resistor; providing a bypass n-channel FET switch; providing a bypass p-channel FET switch; connecting a drain of the main FET switch to the first node and coupling a source of the main FET switch to the second node; coupling a control voltage through the first and the second gate resistors to a gate of the main switch; connecting drains of the n-channel and the p-channel FETs together; connecting sources of the n-channel and the p-channel FETs together; connecting drains of the n-channel and the p-channel FETs to gates of the n-channel and the p-channel FETs respectively; coupling the first gate resistor across the drains and sources of the n-channel and the p-channel FETs, and transitioning the main switch from an OFF to an ON state and vice versa using the control voltage; opening the n-channel FET switch when the main FET switch is in the OFF or the ON state and closing the n-channel FET when the main FET switch is transitioning from the OFF to the ON state, thereby bypassing the first gate resistor, and opening the p-channel FET switch when the main switch is in the OFF or the ON state and closing the p-channel FET switch when the main FET switch is transitioning from the ON to the OFF state, thereby by passing the first gate resistor.

According to a tenth aspect of the present disclosure, a method for digitally tuning a capacitor in an integrated circuit is disclosed, providing: providing a first node; providing a second node; providing an input terminal; providing an output terminal; providing a main switch stack, the main switch stack comprising: a series arrangement of a plurality of main FET switches; series arrangements of a plurality of main bypass switch blocks and a plurality of corresponding main series resistors, the plurality of the main bypass switching blocks comprising a plurality of corresponding bypass switches and a plurality of corresponding main gate resistors; coupling the plurality of the bypass switches across the corresponding plurality of the main gate resistors; coupling the series arrangement of the plurality of main FET switches between the first node and the second node; providing a bypass switch block, the bypass switch block comprising a common switch and a gate series resistor; coupling the common switch across the gate series resistor; providing a common series resistor; coupling the output terminal to corresponding gates of the plurality of the main FET switches via the series arrangements of the plurality of the main bypass switch blocks and the plurality of the corresponding main resistors; connecting the input terminal to the output terminal via series arrangement of the bypass switch block with the common series resistor, and applying a control voltage to the input terminal thereby transitioning the plurality of the main FET switches from an OFF to an ON state and vice versa, and opening the plurality of the bypass switches and the common switch when the plurality of the main FET switches are in the OFF or the ON state and closing the plurality of the bypass switches and the common switch when the plurality of the main switches are transitioning from the OFF to the ON state and vice versa, thereby bypassing the plurality of the main gate resistors and the gate series resistors respectively.

According to an eleventh aspect of the present disclosure, a switching circuit is provided, comprising: a first node; a second node; a first terminal; a second terminal; a third terminal; a fourth terminal; a main FET switch stack, and a bypass FET switch stack; wherein: the main FET switch stack comprises: a series arrangement of a plurality of main FET switches coupled between the first node and the second node, and a plurality of main gate resistors, the plurality of the main gate resistors connecting the second terminal to corresponding gates of the plurality of the main FET switches; the bypass FET switch stack comprises: a series arrangement of a plurality of first bypass FET switches; a series arrangement of a plurality of second bypass FET switches; a plurality of first bypass gate resistors; the plurality of the first bypass gate resistors connecting corresponding gates of the plurality of the first bypass FET switches to the third terminal; a plurality of second bypass gate resistors; the plurality of the second bypass gate resistors connecting corresponding gates of the plurality of the second bypass FET switches to the fourth terminal, and a plurality of drain-source resistances, the plurality of the drain-source resistors being coupled across the corresponding drains and sources of the plurality of the first and the second bypass FET switches; wherein: drains and sources of the first bypass FET switches are connected to corresponding drains and sources of the second bypass FET switches respectively; the drains of the bypass FET switches closest to the first terminal and farthest from the second terminal are connected to the first terminal; the sources of the bypass FET switches closest to the second terminal and farthest from the first terminal are connected to the second terminal; wherein: a first supply voltage applied to the first terminal is configured to transition the plurality of the main FET switches from an OFF to an ON state and vice versa; a second supply voltage applied to the third terminal is configured to open the plurality of the first bypass FET switches when the plurality of the main FET switches are in the OFF or the ON state and to close the plurality of the first bypass FET switches when the plurality of the main FET switches is transitioning from the OFF to the ON state, and a third supply voltage applied to the fourth terminal is configured to open the plurality of the second bypass FET switches when the plurality of the main FET switches are in the OFF or the ON state and to close the plurality of the second bypass FET switches when the plurality of the main FET switches is transitioning from the ON to the OFF state.

According to a twelfth aspect of the present disclosure, an amplifier is provided, comprising: a first node; a second node; an input terminal; an output terminal; a series arrangement of a plurality of FET transistors coupled between the first node and the second node; one or more switching blocks, each of the one or more switching blocks comprising a bypass switch coupled across a gate resistor; wherein: the input terminal is configured to receive an input RF signal and the output terminal is configured to provide an output RF signal; each of the one or more switching blocks couples a control voltage to a gate of a corresponding FET transistor, wherein the control voltage is configured to transition the corresponding FET transistor from an OFF to an ON state and vice versa, and the bypass switch of each of the one or more switching blocks is configured to open when the corresponding FET transistor is in the OFF or the ON state and to close when the corresponding FET transistor is transitioning from the OFF to the ON state and vice versa, thereby passing the corresponding gate resistor.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 3D shows some voltage levels of the switching circuit of FIG. 3A when in the ON state FIG. 3E shows some voltage levels of the switching circuit of FIG. 3A during transition from the ON state to the OFF state.

FIG. 4A' shows an alternative embodiment of the switching circuit of FIG. 4A.

DETAILED DESCRIPTION OF THE INVENTION

Figures 1A, 1B:
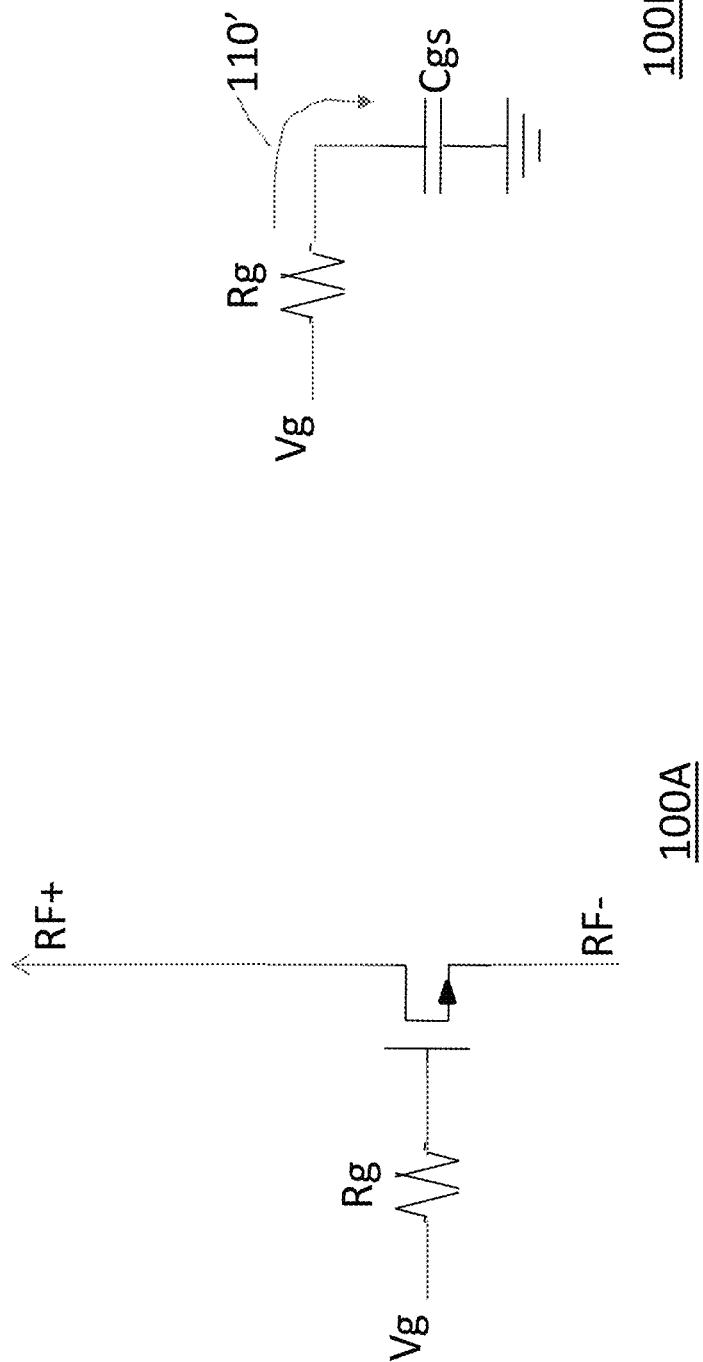
FIG. 1A shows a prior art FET switch with a gate resistor.
FIG. 1B shows a simplified partial model of the FET switch of FIG. 1A transitioning from OFF to ON state.
Figure 2B:
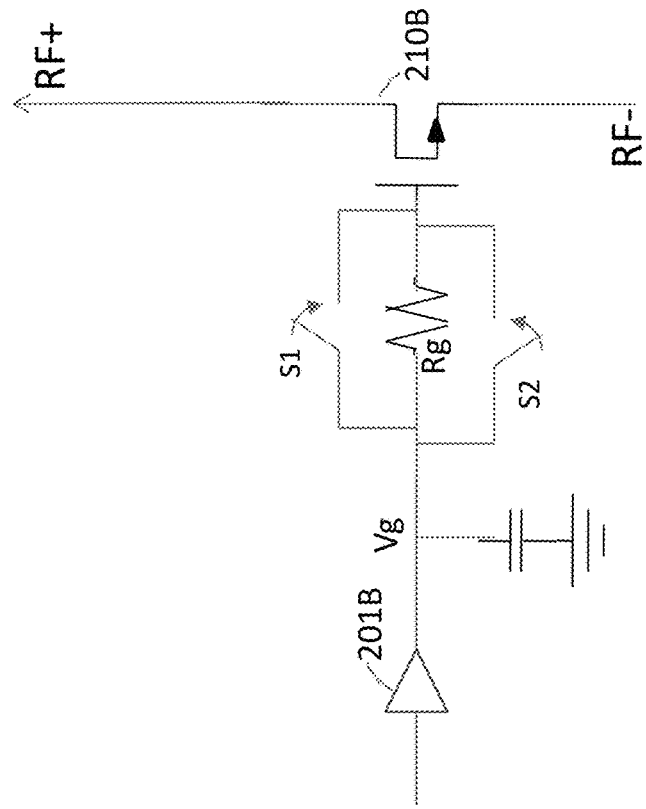
FIG. 2B shows a switching circuit using two bypass switches across the gate resistor.
Figure 2A:
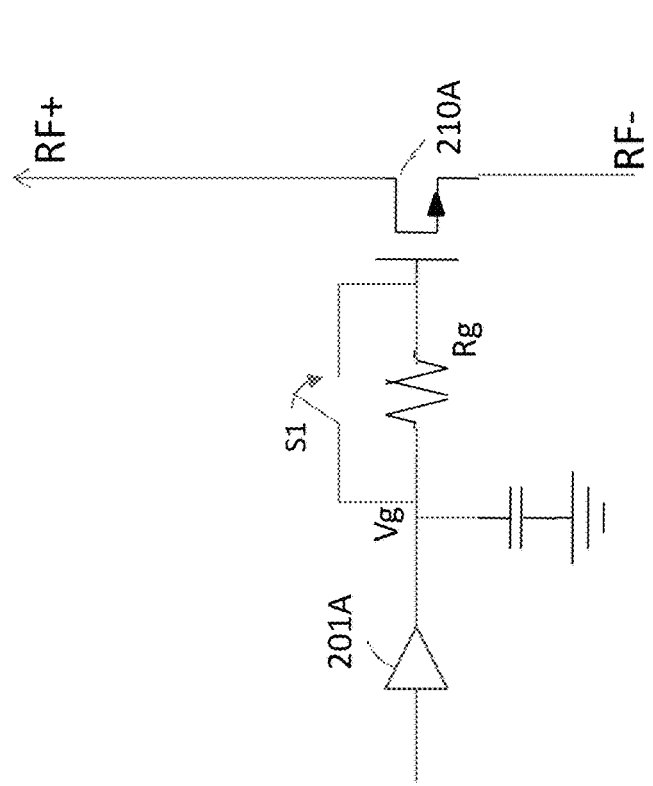
FIG. 2A shows a switching circuit using one bypass switch across the gate resistor.

FIG. 2A shows a switching circuit 200A according to an embodiment of the present disclosure. The switching circuit 200 comprises a main FET switch 210A connected to a digital control driver 201A through a gate resistor Rg. The digital control driver 201A supplies a control voltage Vg to drive the main FET switch 210A from an OFF to an ON state and vice versa. Also shown in FIG. 2A is a bypass switch S1 coupled across the gate resistor Rg. Furthermore, a source of the main FET switch 210A is connected to a second node RF. As described above and in reference to FIG. 1, the gate resistor Rg is designed to meet all performance requirements of the switching circuit 200 such as power/voltage handling, insertion loss, die area, lower frequency corner etc.

Referring to FIG. 2A, in a steady state condition and during normal operation, the bypass switch S1 is open and therefore, it has no impact on the rest of the circuit. In accordance with an embodiment of the disclosure, the bypass switch S1 is configured to close during transitions from an OFF state to an ON state and from the ON state to the OFF state. In other words, during such transitions, the gate resistor Rg is shorted due to the bypass switch S1 being closed and this will result in a very fast switching time. The person skilled in the art will appreciate that during switching, a gate-source capacitance Cgs of the main FET switch 210A will see a very small (current is being drawn through the bypass switch as opposed the gate resistor) series resistance and that's the main reason why the switching time is very fast. The person skilled in the art will also appreciate that in steady state conditions, the bypass switch S1 open and therefore, the gate resistor Rg can be designed to meet all performance requirements of the switching circuit 200A independently from switching speed requirements. This is accomplished by virtue of decoupling a gate resistance from the switching speed requirements in accordance with the teachings of the disclosure.

FIG. 2B shows a switching circuit 200B in accordance with another embodiment of the present disclosure. The switching circuit 200B comprises two bypass switches S1 and S2. Similar to what was described in reference to the circuit 200A shown in FIG. 2A, in an operative condition and while in steady state, both of the bypass switches S1 and S2 are open and therefore they have no impact on the rest of the switching circuit 200B. In accordance with an embodiment of the disclosure, the bypass switches S1 and S2 are configured to be closed and open respectively during a transition from an OFF to ON state. On the other hand and in a similar way, during a transition from the ON to the OFF state, the bypass switch S1 is configured to be open and the bypass switch S2 is configured to be closed. As a result, during any switching period, the resistance Rg is shorted by one of the bypass switches S1 or S2 and therefore, the switching circuit 200B will benefit from a very fast switching time and in a similar way as described with reference to the switching circuit 200A of FIG. 2A.

Figure 2C:
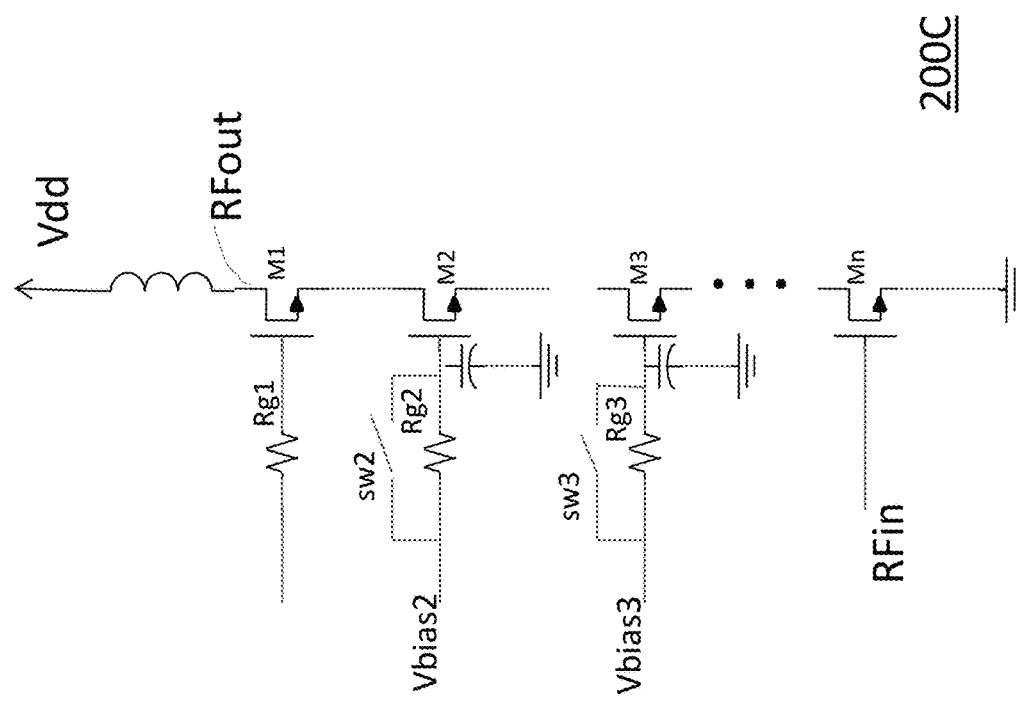
FIG. 2C shows an amplifier with stacked configuration and using the bypassing methods in accordance with the teachings of the present disclosure.

FIG. 2C shows a further embodiment where the teachings according to the present disclosure and as described with reference to FIGS. 2A-2B are applied to an amplifier 200C. The amplifier 200C comprises a plurality of FET transistors M1, M2, ..., Mn arranged in a stack configuration. An input RF voltage RFin is applied to a gate of the FET transistor Mn and an output RF voltage RFout is provided at a drain of the FET transistor M1. Also shown in FIG. 2C are bypass switches sw1 and sw2 coupled across gate resistors Rg1 and Rg2. A function of bypass switches sw1 and sw2 is similar to what described with reference to the bypass switch S1 of FIG. 2A. In a similar way as described with reference to the digital control driver 201A of FIG. 2A, digital control drivers Vbias2 and Vbias3 supply control voltages to drive the corresponding FET transistors M2 and M3 from and ON state to an OFF state and vice versa. Similar to the embodiments shown in FIGS. 2A-2B and by virtue of bypassing gate resistors, switching speed of the transistors M2 and M3 transitioning ON state to OFF state and vice versa is much faster compared to a case where such bypassing is not used.

With further reference to FIG. 2C, the person skilled in the art will appreciate that other embodiments are also possible wherein bypass switching may be applied to one or more of the FET transistors anywhere within the FET transistors stack.

Figure 3A:
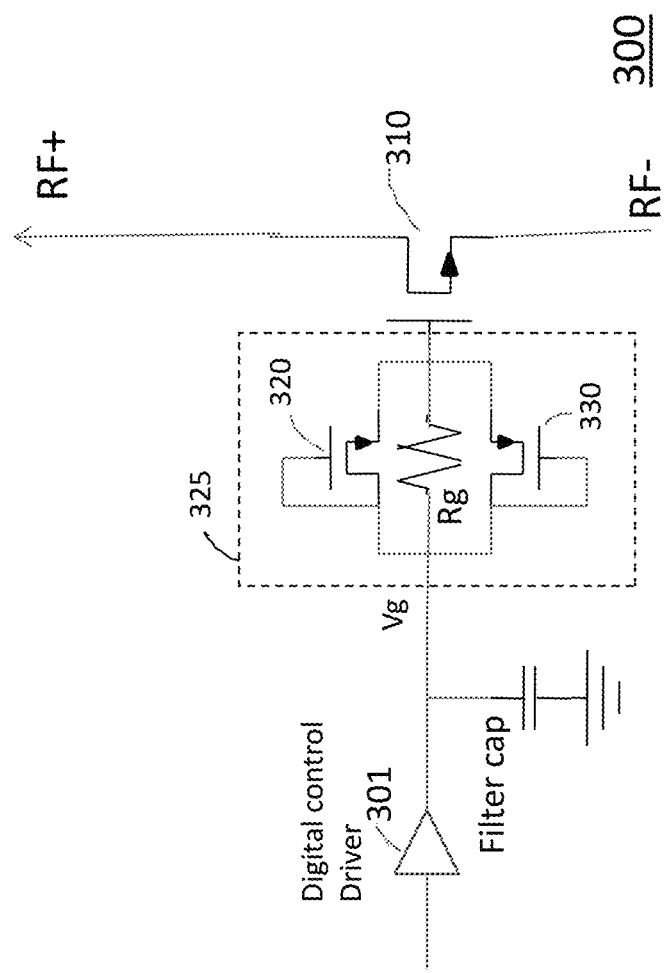
FIG. 3A shows a switching circuit using NMOS and PMOS FET switches

FIG. 3A shows a switching circuit 300 according to a further embodiment of the disclosure. Also shown in FIG. 3A is a digital control driver 301 providing a control voltage Vg. The switching circuit 300 further comprises a gate bypass switch 325, the gate bypass switch 325 comprising two bypass FET switches 320 and 330 connected each across a gate resistor Rg. The bypass FET switches 320 and 330 are NMOS and PMOS type FET transistors respectively in accordance with an embodiment of the present disclosure. The drains of the two bypass FET switches 320 and 330 are connected to their respective gates and as such, the bypass switches are configured to function as diodes. Also shown in FIG. 3A is a main FET switch 310, a gate of which is connected to the digital control driver 301 via the gate resistor Rg. Referring back to FIG. 2B and as described more in detail in below, the bypass FET switches 320 and 330 are analogous to the bypass switches S1 and S2 and the principal of operation of the switching circuit 300 is similar to what was described with reference to the switching circuit 200B of FIG. 2B.

Figure 3C:
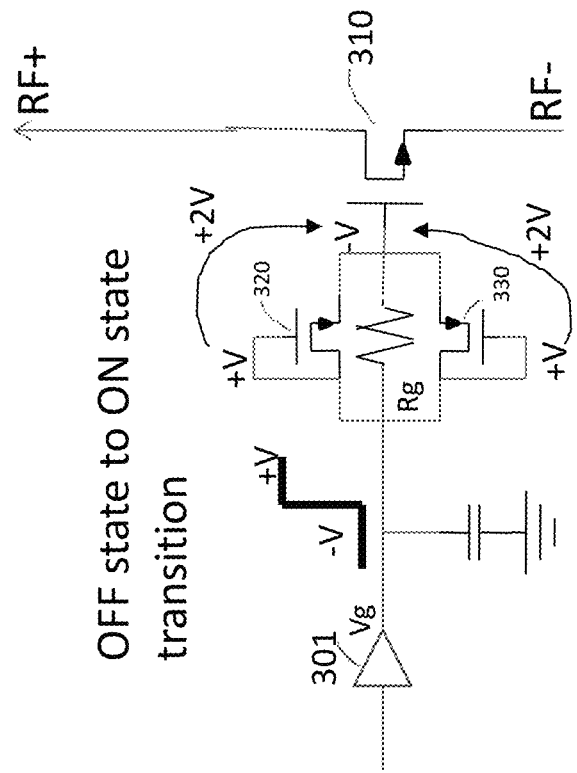
FIG. 3C shows some voltage levels of the switching circuit of FIG. 3A during transition from an OFF state to an ON state.
Figure 3B:
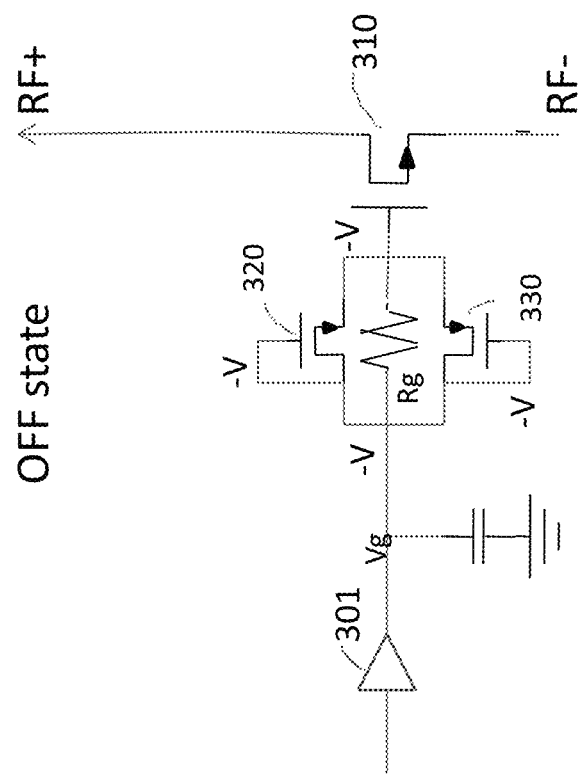
FIG. 3B shows some voltage levels of the switching circuit of FIG. 3A when in OFF state.

FIGS. 3B-3E show the switching circuit 300 of FIG. 3A in various operative conditions (e.g., OFF state, ON state, transition from OFF to ON state and transition from ON to OFF state). By way of example, it is assumed that the bypass FET switches 320 and 330 require a certain non-zero voltage level from gate to source to turn on. Continuing with the same example, it is further assumed that the control driver 301 provides a negative voltage −V and a positive voltage +V to disable and enable respectively the main FET switch 310 during operation. Also shown in each of the FIGS. 3B-3E are voltage levels at gates and sources of the bypass FET switches 320 and 330 in each operative condition. Referring to FIG. 3B, in an OFF state, all voltage levels as shown are at −V and as a result, the bypass FET switches 320 and 330 as well as the main FET switch 310 are all OFF. With reference to FIG. 3C, a transition from the OFF state to the ON state is triggered by the control voltage Vg going from −V to +V. As a result, a gate-source junction of the bypass FET switches 320 and 330 will experience a positive voltage 2V. This means the bypass FET switch 330 will remain off while the bypass FET switch 320 will turn on and will short the gate resistor Rg. Further referring to FIG. 3C, during the transition from the OFF state to ON state and based on what was just described, a current to charge the gate-source capacitance of the main FET switch 310 is drawn through the bypass FET switch 320 and this result in a faster switching speed. Further continuing with this example, FIG. 3D corresponds to a case where the switching circuit 300 is in the ON state. Voltage levels at gates and sources of the bypass FET switches 320 and 330 are all at +V and therefore both switches are OFF. Referring now to FIG. 3E, the transition from the ON state to the OFF state will occur when the control voltage Vg toggles from +V to −V. In a similar way as described with reference to FIG. 3C, the bypass FET switch 320 remains off (e.g., gate-source voltage remains at −2V) and the bypass FET switch 330 turns on (e.g., gate-source voltage goes to −2V) to short the gate resistor Rg and as a result, the switching speed is accelerated. The person skilled in the art will understand that the description above with reference to FIGS. 3A-3E assumes that the transition of the control voltage Vg is instantaneous and the transition of FET bypass switches 320 and 330 take a longer time. In more practical situation, the bypass FET switches 320 and 330 will start their transition as the control Voltage Vg makes its transition.

With reference to FIGS. 3A-3E, although in a preferred embodiment the bypass FET switches 320 and 330 are gate-drain shorted, a person skilled in the art will understand that different embodiments may be envisaged wherein the gates of the bypass FET switches 320 and 330 are connected to their respective drains of the bypass FET switches 320 and 330 via corresponding resistors.

Referring back to FIG. 3A and as described above, the gate resistor Rg is fully bypassed during transitions. Embodiments in accordance with the present disclosure wherein a partial bypassing of the gate resistor is implemented are also possible. Such embodiments are described more in detail next.

Figure 3F:
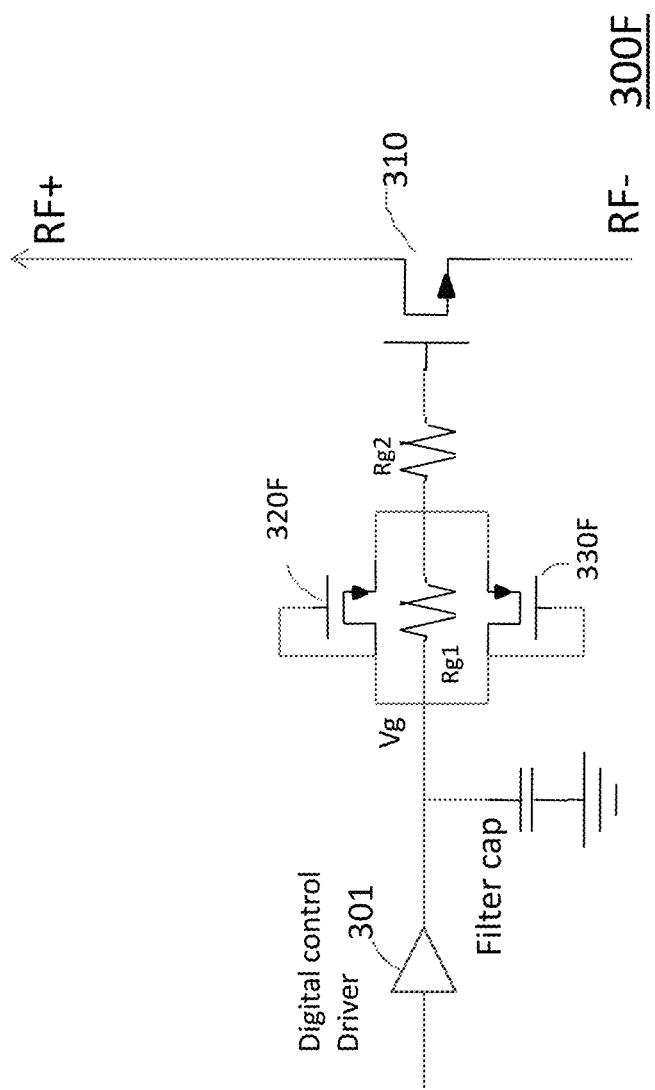
FIG. 3F shows a switching circuit using a concept of partial bypassing.

FIG. 3F shows a switching circuit 300F in accordance with a further embodiment of the present disclosure. The switching circuit 300F comprises two gate resistors Rg1 and Rg2 connected in series wherein bypass FET switches 320F and 330F are coupled across the gate resistor Rg1. The principal of operation of the switching circuit 300F is similar to the one described for the switching circuit 300 with reference to FIGS. 3A-3E. Referring to the switching circuit 300F of FIG. 3F and in an operative condition, a portion of a possible large RF swing is absorbed by the gate resistor Rg2 and therefore, the bypass FET switches 320F and 330F of FIG. 3F would have less stringent requirements in terms of voltage breakdown and compared to that of the bypass FET switches 320 and 330 of FIG. 3A. This means the bypass FET switches 320F and 330F may have smaller sizes and therefore they occupy a smaller die area. However, given that the gate resistor Rg2 is not shorted during transitions, the switching circuit 300F will have a longer switching time compared to the switching circuit 300 of FIG. 3A. With further reference to FIG. 3F, the person skilled in the art will understand that a concept of partially bypassing the series gate-resistor as suggested above and in accordance with the present disclosure, is a matter of tradeoff between switching time, voltage handling capability of the bypass FET switches 320F and 330F as well as die area requirements.

In high power RF applications, main FET switches may experience large voltage swings (for example, 20V peak to peak) which increase the risk of breakdowns. A way to overcome this is to implement main switches in stack configurations. Furthermore, turning back to the depiction of FIG. 3A, the bypass FET switches 320F and 330F may also experience as large an RF voltage levels as that the main FET switch 310 would be exposed to. As such, careful design decisions may be made to avoid breakdowns of both bypass and main FET switches. In what follows, embodiments according to the disclosure implementing stacked configurations and offering solutions to this design challenge are described in more detail.

Figure 4A:
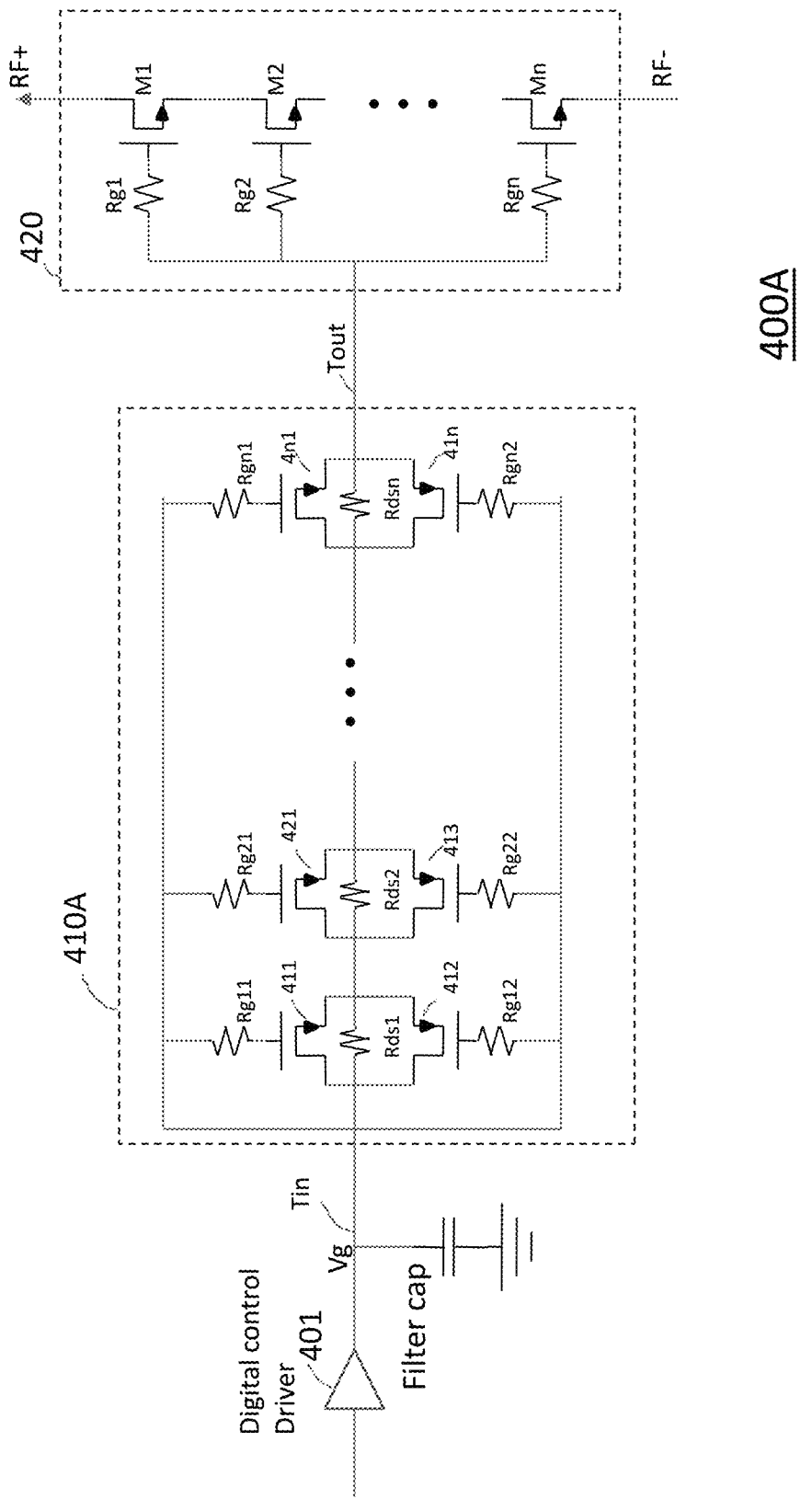
FIG. 4A shows switching circuit implementing main switches and bypass switches in a stack configuration.
Figure 4A:
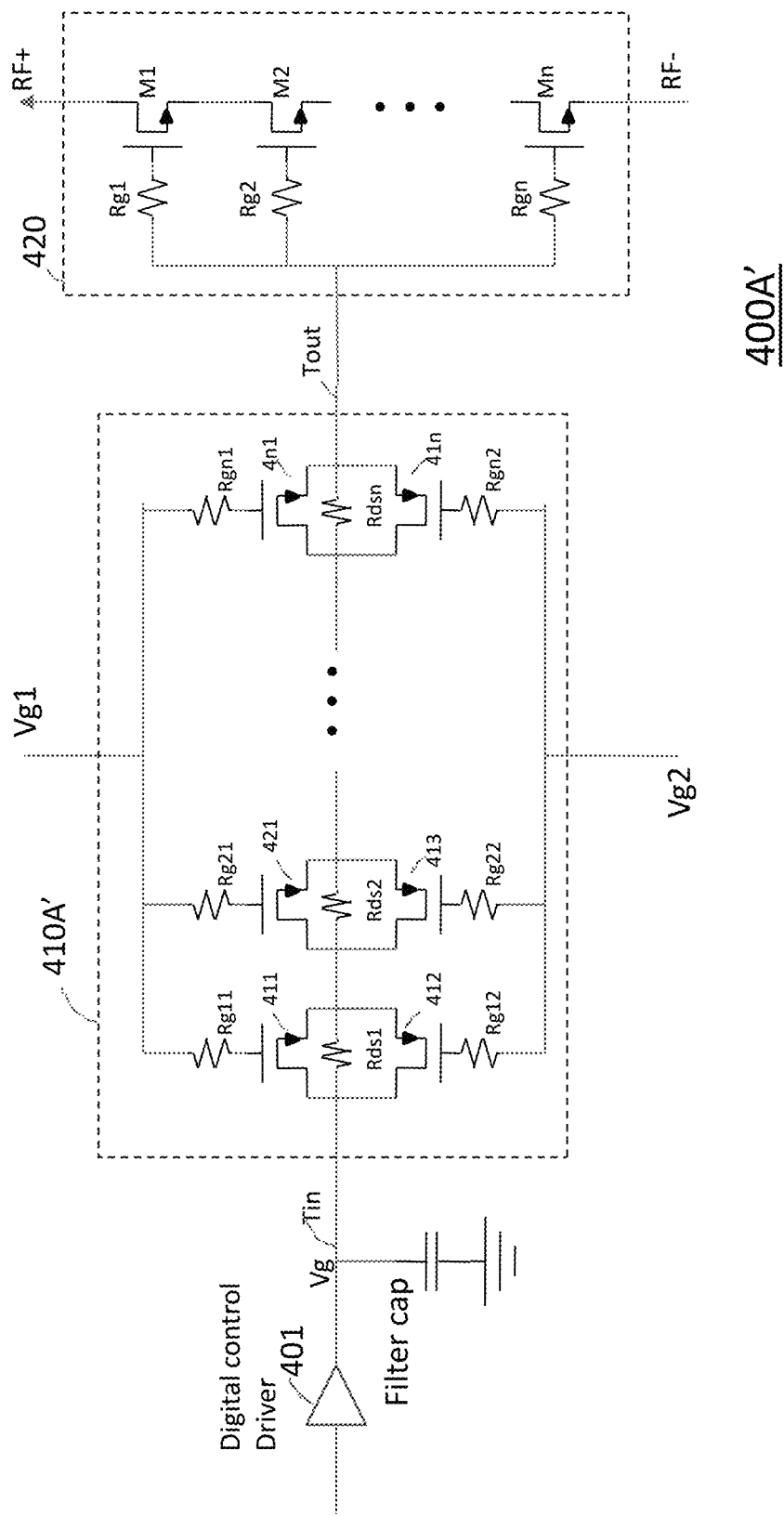

FIG. 4A shows a switching circuit 400A according to an embodiment of the present disclosure. The switching circuit 400A comprises a main FET switch stack 420 and a bypass FET switch stack 410A. The main FET switch stack 420 comprises a plurality of stacked main FET switches (e.g., M1, M2, . . . and Mn) and a plurality of main gate resistors (e.g., Rg1, Rg2, . . . and Rgn). An input terminal Tin and an output terminal Tout are also shown in FIG. 4A. The plurality of the main gate resistors connects the terminal Tout to corresponding gates of the plurality of the stacked main FET switches. The bypass FET switch stack 410A comprises a plurality of stacked first bypass FET switches (e.g., bypass FET switches 411,421, . . . and 4n1) and a plurality of stacked second bypass FET switches (e.g., bypass FET switches 412, 422, . . . and 41n). In accordance with an embodiment of the present disclosure, the bypass FET switch stack 410A comprises a plurality of first bypass gate resistors (e.g., bypass gate resistors Rg11, Rg21, . . . and Rgn1), the plurality of the first bypass gate resistors connecting corresponding gates of the plurality of the stacked first bypass FET switches to the input terminal Tin. FIG. 4A further shows a plurality of second bypass gate resistors (e.g., Rg12, Rg22, . . . and Rgn2), the plurality of the second bypass gate resistors coupling corresponding gates of the plurality of the stacked second bypass FET switches to the input terminal Tin. Drains and sources of the stacked first bypass FET switches are connected to corresponding drains and sources of the second stacked bypass FET switches respectively. Moreover, the drains of the first and second bypass FET switches closest to the input terminal Tin and farthest from the output terminal Tout (e.g., bypass FET switches 411 and 412) are connected to the terminal Tin. Similarly, the sources of the first and second bypass FET switches closest to the output terminal Tout and farthest from the input terminal Tin are connected to the output terminal Tout. In accordance with a further embodiment of the disclosure, the gates and the drains of the plurality of the first bypass FET switches are connected together. Furthermore, the gates and the drains of the plurality of the second bypass FET switches are also connected together. According to an embodiment of the present disclosure, the bypass FET switch stack 410A further comprises a plurality of drain-source resistors (e.g., Rds1, Rds2, . . . and Rdsn). The plurality of drain-source resistors are coupled across the corresponding drains and sources of the plurality of the stacked first and second bypass FET switches.

Further referring to FIG. 4A, the switching circuit 400A comprises a digital control driver 401, the digital control driver 401 providing a control voltage Vg at the input terminal Tin. The person skilled in the art will appreciate that due to a nature of a stacked configuration, only smaller portions of a large RF swing across the terminals Tin and Tout will appear across each of the stacked bypass FET switches and this will reduce significantly risks of breakdown. As a result, designs of circuits using smaller bypass FET switches occupying smaller die areas are made possible. Generally speaking, although the bypass FET switches may see as large RF swings as the main FET switches, they will see a much smaller power as smaller currents flow through them during an operative condition. As such, in accordance with some embodiments of the disclosure, bypass FET switches with much smaller size than main FET switches may be used. By way of example, in various embodiments of the disclosure a size ratio (e.g., size of a bypass switch relative to a size of a main switch) of 1/100 or 1/1000 may apply.

With continuous reference to FIG. 4A and as described before, the bypass FET switch stack 410A may experience same level of RF swings as that across the main FET switch stack 420 in an operative condition. As such, although in a preferred embodiment bypass and main FET switches use same number of switches in their respective stacks, the person skilled in the art will understand that embodiments implementing different number of switches in the bypass FET switch stack 410A and the main FET switch stack 420 may also be envisaged.

Referring back to FIG. 3A, the plurality of the stacked first and second bypass FET switches shown in FIG. 4A are analogous to the bypass FET switches 320 and 330 respectively and the plurality of the drain-resistors of FIG. 4A, coupled in series together as shown will provide an equivalent resistor that is analogous to the gate resistor Rg of FIG. 3A. As such, the principal of operation of the switching circuit 400A is similar to what was described previously and with reference to switching circuit of FIG. 3A. Although in a preferred embodiment of the present disclosure, gate resistors with same resistances are used and drain-source resistances are all the same, the person skilled in the art will understand that embodiments using different resistors are also possible. More in particular and as further explained below, embodiments may also be envisaged wherein no drain-resistors across drains and gates of the bypass switches are used.

With further reference to FIG. 3A and based on what described previously, the first and second bypass FET switches are in OFF state in accordance with some embodiments of the disclosure. In an operative condition and by way of example, voltage levels at source and gate of each of the first or second bypass FET switches may both be at 0V. In other words a voltage difference of 3V across gate-source is used to keep the bypass FET switches OFF during normal operation. However, in some applications involving large RF swings, the 3V voltage difference may not be enough to keep the bypass FET switches OFF and they may turn ON due to such large RF swings. There are different ways to overcome such issue according to embodiments of the present disclosure. For example, embodiments implementing a higher number of bypass FET switches or implementing bypass FET switches with higher threshold levels are possible. Embodiments may also be used wherein partial bypassing (described in more detail below) is used to overcome the described issue. Further embodiments may also be envisaged wherein the bypass FET switches are maintained in deeper OFF state by using control voltages that provide larger negative voltages. For example, embodiments are possible wherein a voltage level of 3V across gate-source junctions is used to keep the bypass FET switches OFF during operative conditions without having a risk of being turned on due to large RF amplitude levels.

With further reference to the bypass FET switch stack 410A of FIG. 4A and in accordance with the teachings of the disclosure, other embodiments may be envisaged. By way of example, FIG. 4A' shows a switching circuit 400A' comprising a bypass FET switch stack 410A'. Differently from the bypass FET switch stack 410A, in the bypass FET switch stack 410A', the gates of the plurality of the stacked first and second bypass FET switches are not connected to the input terminal Tin. Moreover, control voltages Vg1 and Vg2 are also shown in FIG. 4A'. The control voltages Vg1 and Vg2 are applied to gates of the plurality of the stacked first and second bypass FET switches respectively and through corresponding gate resistors. A combination of the control voltages Vg, Vg1 and Vg2 provides required control voltages for a bypassing functionality similar to what was described with reference to the bypass FET switch stack 410A of FIG. 4A.

Figure 4B:
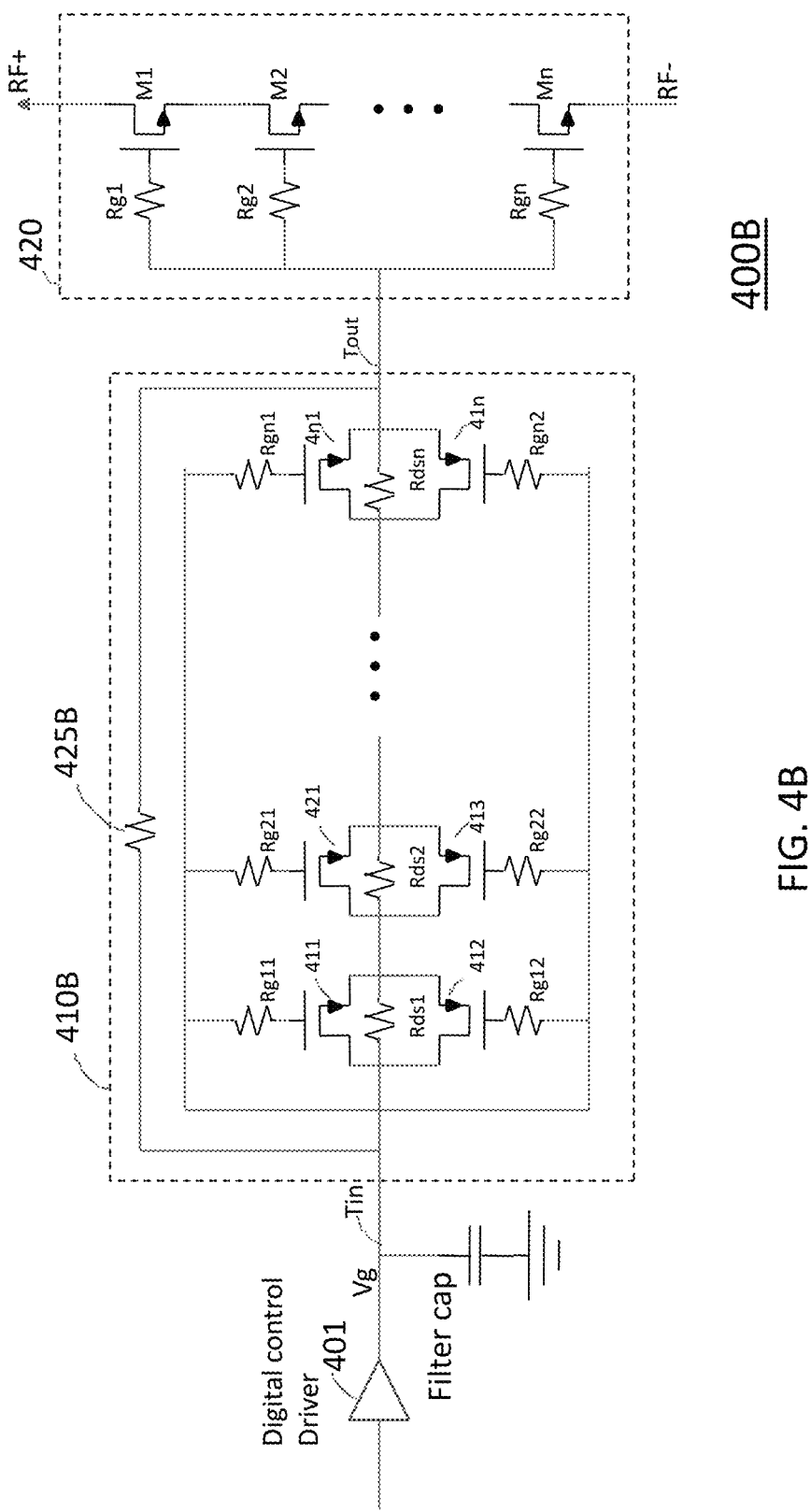
FIG. 4B shows a switching circuit implementing stacked main switches and bypass switches with a through resistor coupled across the bypass switches.

FIG. 4B shows a switching circuit 400B according to another embodiment of the present disclosure. The switching circuit 400B comprises the bypass FET switch stack 400A of FIG. 4A wherein a through resistor 425B is coupled across the input terminal Tin and the output terminal Tout. Referring back to FIG. 4A, the principal of operation of the switching circuit 400B is similar to that of the switching circuit 400A.

Figure 4C:
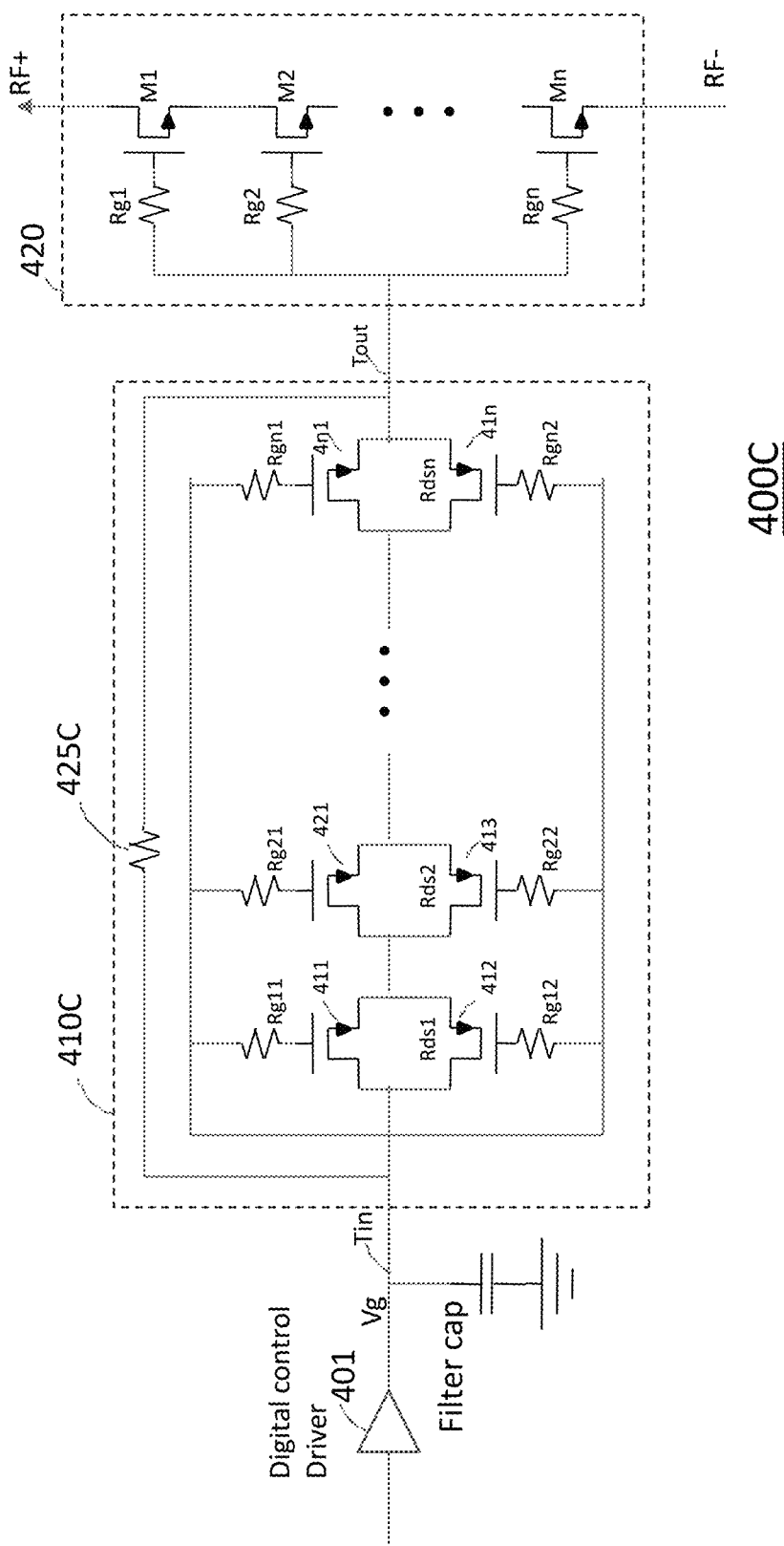
FIG. 4C shows a further switching circuit implementing stacked main switches and bypass switches with a through resistor coupled across the bypass switches and wherein no drain-source resistor is used in the bypass switches.

FIG. 4C shows a switching circuit 400C according to another embodiment of the present disclosure. The switching circuit 400C comprises a bypass FET switch stack 410C. With reference to FIG. 4B, the bypass FET switch stack 410C has a similar structure to that of the bypass FET switch stack 410C except that no drain-resistors across drains and gates of the bypass FET switches are used in the bypass FET switch stack 410C. The principal of operation of both of the switching circuits 400C and 400C remains the same Generally speaking, implementing gate resistors when designing stacked switches may be done either using a gate resistor common to all FET switches or else separate gate resistors for each individual FET switch in the stack may be used. Designs using a combination of the mentioned implementations are also possible. In what follows, embodiments using such implementations combined with the teaching of the present disclosure will be described more in detail.

Figure 4E:
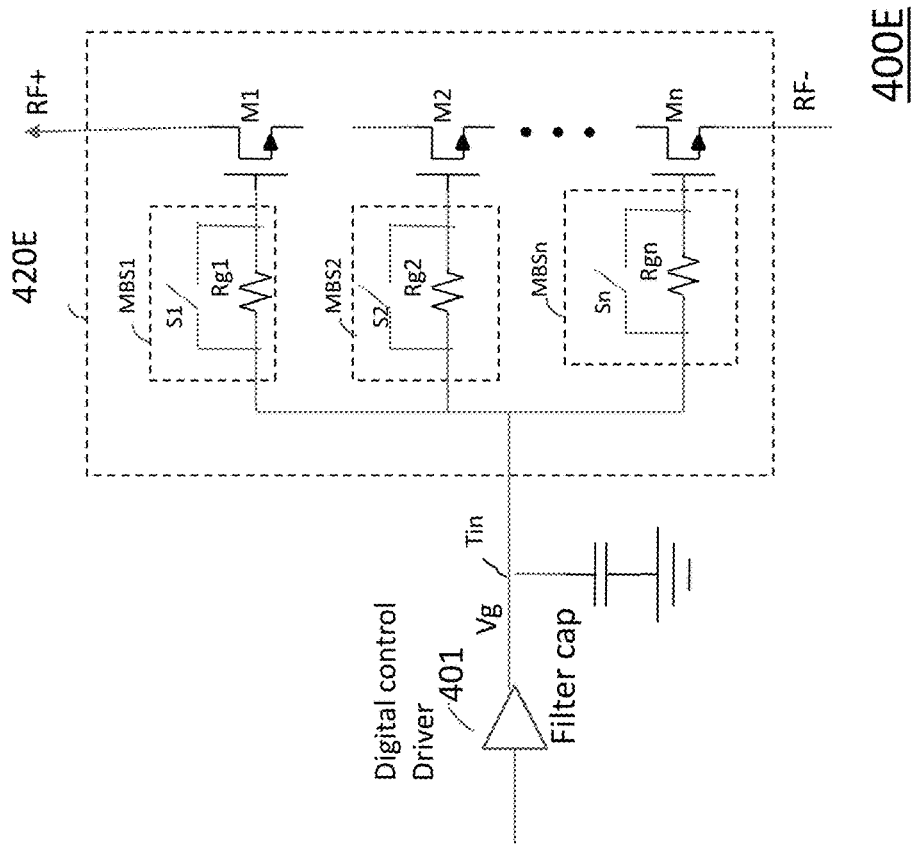
FIG. 4E shows a switching circuit comprising stacked main switches using individual gate resistors.
Figure 4D:
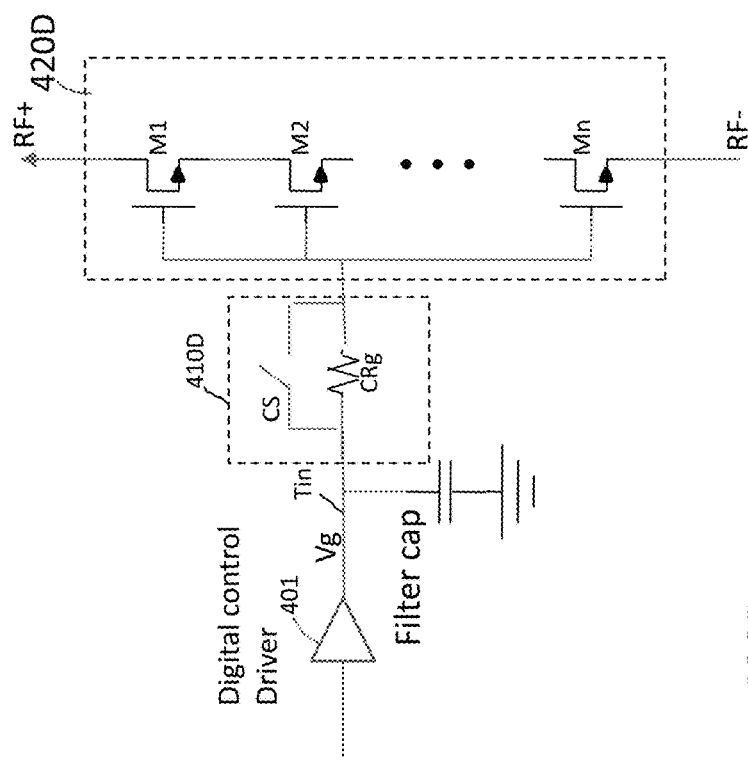
FIG. 4D shows a switching circuit comprising stacked main switches with a common gate resistor.

FIG. 4D shows a switching circuit 400D according to a further embodiment of the disclosure. The switching circuit 400D comprises a main FET switch stack 420D and a bypass switching block 410D, the bypass switching block 410D comprising a common switch CS coupled across a common gate resistor CRg. The main FET switch stack 420D comprises a plurality of stacked main switches (e.g., M1, M2, . . . and Mn) gates of which are all connected together. The common gate resistor CRg is coupled at one end to an input terminal Tin and at another end to the gates of the plurality of the stacked main switches. Note that according to an embodiment of the disclosure, the switching circuit 400D is implemented using a common gate resistor (e.g., CRg) used in common by all the stacked main FET switches of the main FET switch stack 420D. This is in contrast with an idea of using individual gate resistors for each stacked switch of a main FET switch stack as implemented by a switching circuit 400E as shown in FIG. 4E and in accordance with a further embodiment of the present disclosure. The switching circuit 400E comprise a main switch stack 420E, the main switch stack 420E comprising a plurality of main bypass switch blocks (e.g., MBS1, MBS2, . . . and MBSn). Each of the plurality of the main bypass switch blocks comprises a bypass switch (e.g., S1, S2, . . . and Sn), each bypass switch being coupled across a main gate resistor (e.g., Rg1, Rg2, . . . and Rgn). The main gate resistors are all coupled at one end together and to the input terminal Tin and at another end to corresponding gates of the plurality of the stacked main FET switches. The principal of operation of the switching circuits 400D and 400E, their switching mechanism and related performance tradeoffs are all similar to what was described previously and in reference to FIG. 2A. Comparing the two switching circuits 400D and 400E, a main advantage of the switching circuit 400E is that a better individual control of performance metrics such as switching speed, power handling, lower frequency performance, insertion loss, etc. is made possible through individual main gate resistors (e.g., Rg1, Rg2, . . . and Rgn). On the other hand, the switching circuit 400E comes with an inherent drawback of occupying a larger die area due to a fact that a larger number of bypass switches are implemented in this switching circuit compared to the switching circuit 400D of FIG. 4D.

With further reference to FIGS. 4D-4E and based on related concepts as taught in the present disclosure, the person skilled in the art will understand that embodiments using various implementations of the main bypass switch blocks (e.g., MBS1, MBS2, . . . and MBSn) and the bypass switching block 410D is possible. In what follows, few examples of such embodiments are described.

Figure 4F:
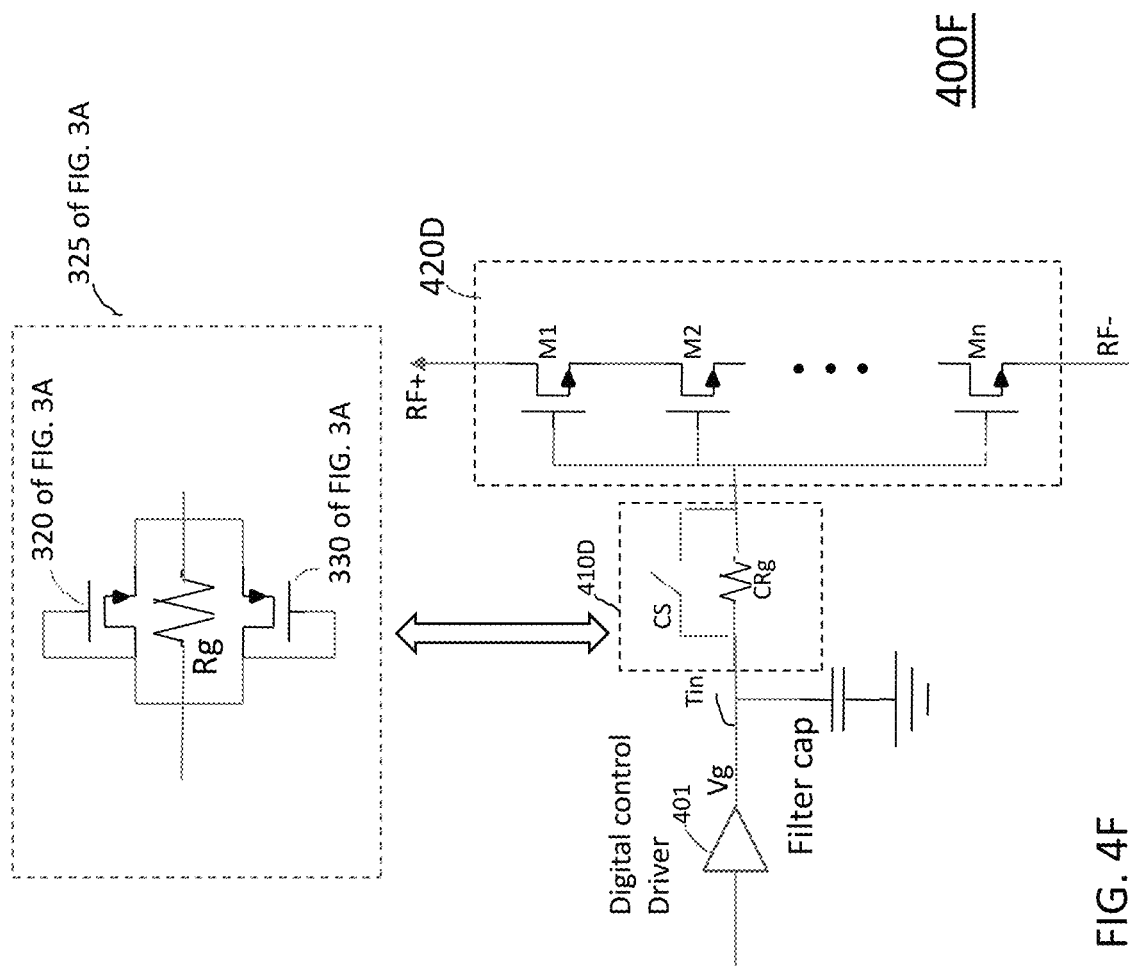
FIG. 4F shows an implementation of the switching circuit of FIG. 4D according to an embodiment of the disclosure.

FIG. 4F shows a switching circuit 400F according to another embodiment of the disclosure. Referring back to FIG. 3A and FIG. 4F, the switching circuit 400F is the switching circuit 400D, wherein the bypass switch block 410D comprises the gate bypass switch 325 of FIG. 3A.

Figure 4G:
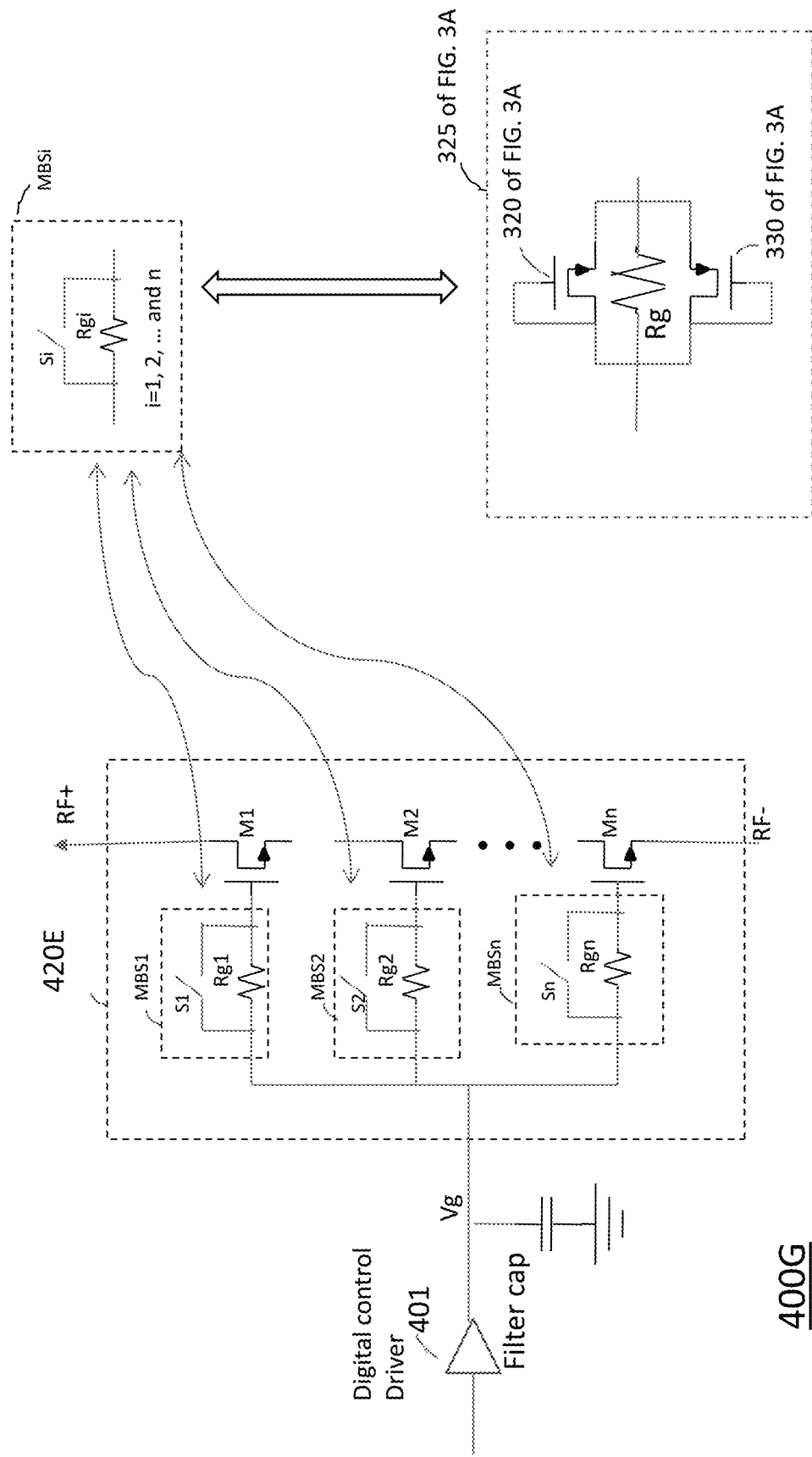
FIG. 4G shows an implementation of the switching circuit of FIG. 4E in accordance with an embodiment of the present disclosure.
Figure 4H:
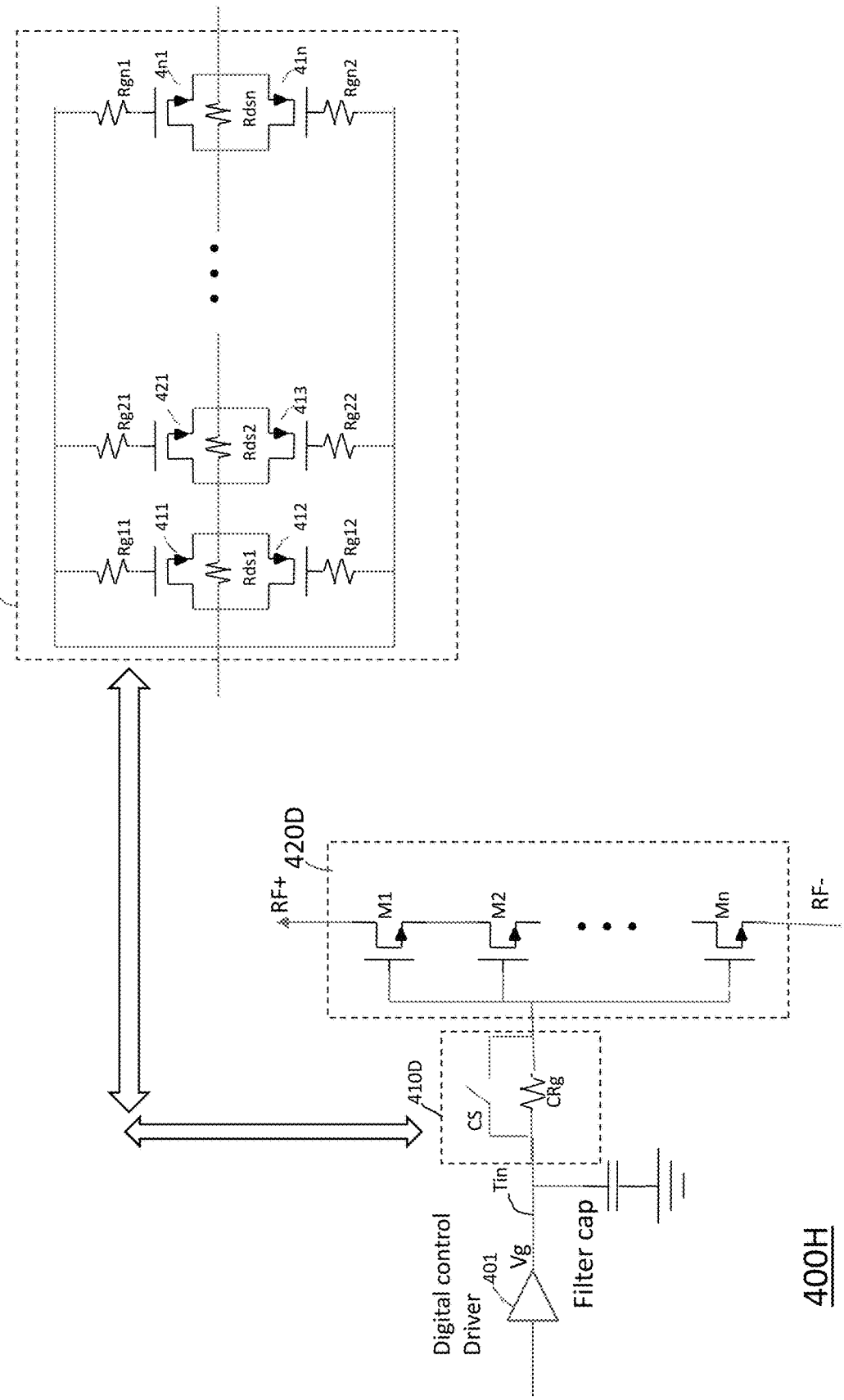
FIG. 4H shows another implantation of the switching circuit of FIG. 4D according to a further embodiment of the disclosure.

FIG. 4G shows a switching circuit 400G according to another embodiment of the disclosure. Referring back to FIG. 3A and FIG. 4E, the switching circuit 400G is the switching circuit 400E, wherein each of the main bypass switch blocks (e.g., MBSi, i=1,2 . . . and n) comprises the gate bypass switch 325 of FIG. 3A FIG. 4H shows a switching circuit 400H according to another embodiment of the disclosure. Referring back to FIG. 4A and FIG. 4D, the switching circuit 400H is the switching circuit 400D, wherein the bypass switching block 410D comprises the bypass FET switch stack 410A of FIG. 4A.

Figure 4I:
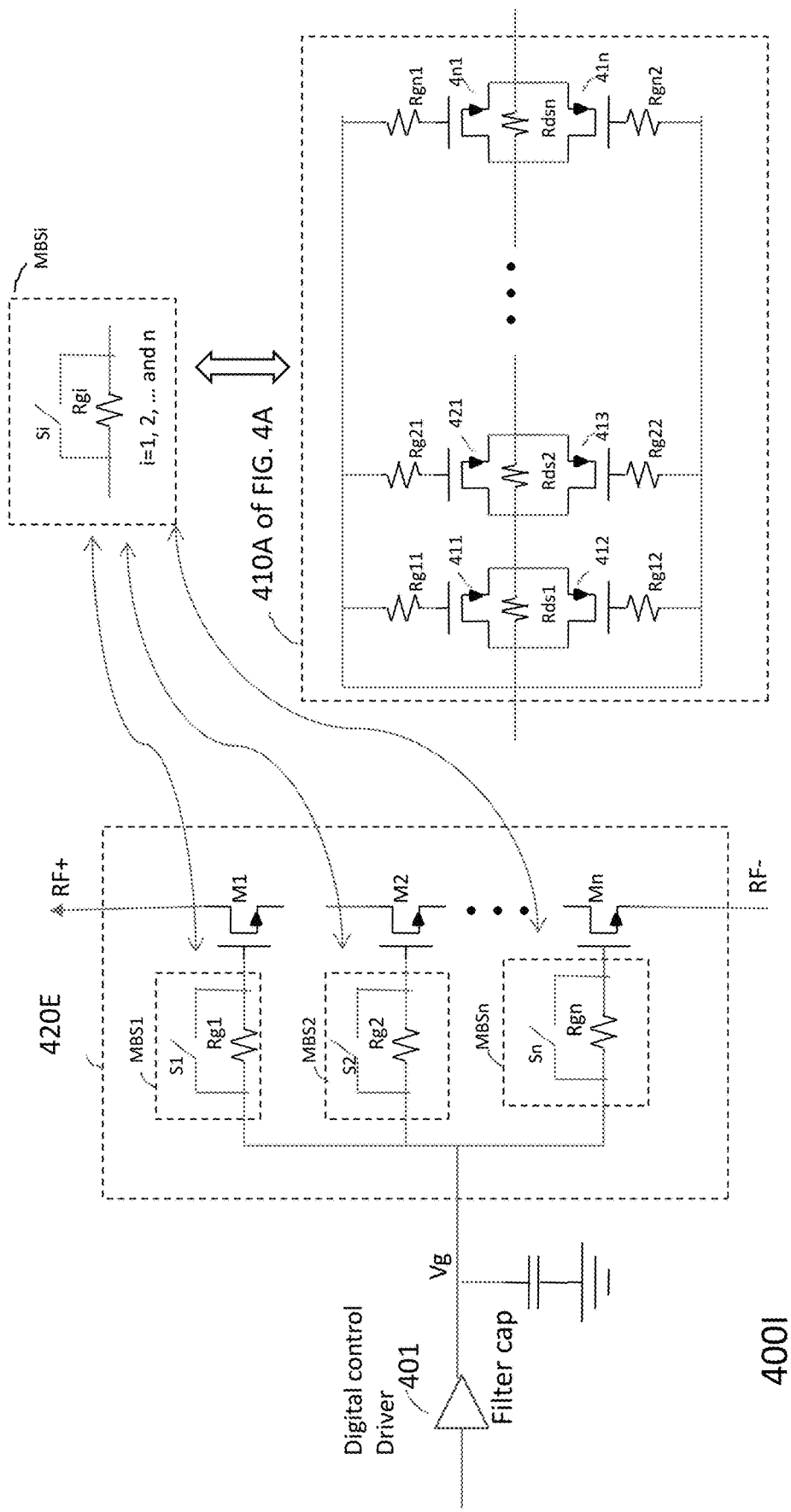
FIG. 4I shows a further implementation of the switching circuit of FIG. 4E in accordance with another embodiment of the present disclosure.

FIG. 4I shows a switching circuit 400I in accordance with a further embodiment of the present disclosure. Referring back to FIG. 4A and FIG. 4E, the switching circuit 400I is the switching circuit 400E, wherein each of the main bypass switch blocks (e.g., MBSi, i=1,2 . . . and n) comprises the bypass FET switch stack 410A of FIG. 4A.

Turning back to the depiction FIG. 3F and as described previously, partial bypassing of gate resistors is a way to achieve a desired tradeoff in terms of voltage handling, die area and switching response. In what follows, embodiments in accordance with the present disclosure wherein partial bypassing are applied to gate resistors that are common to main switches and/or to the ones coupled in series with gates of individual stacked main switches, are described more in detail.

Figure 4J:
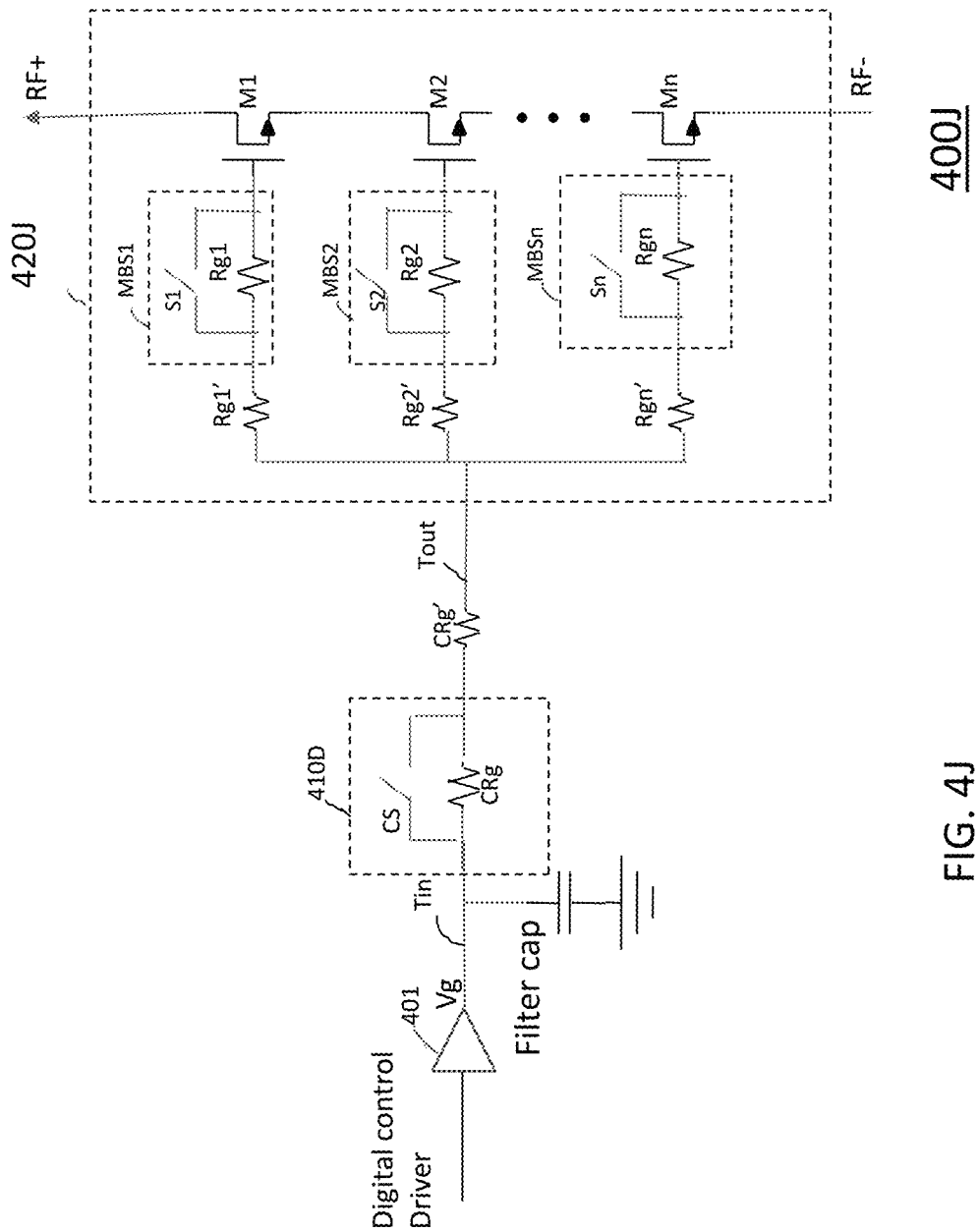
FIG. 4J shows a switching circuit applying the concept of partial bypassing to the common gate resistors as well as individual gate resistors.

FIG. 4J shows a switching circuit 400J in accordance with a further embodiment of the present disclosure. The switching circuit 400J comprises a main switch stack 420J, the main switch stack 420J comprising a plurality of main series resistors (e.g., Rg1', Rg2', . . . and Rgn'). Each resistor of the plurality of main series resistors connects the output terminal Tout to a corresponding main bypass switch block (e.g., MBS1, MBS2, . . . and MBSn) in accordance with an embodiment of the present disclosure. The switching circuit 400J further comprises a common series resistor CRg', the common series resistor CRg' connecting the bypass switching block 410D to the output terminal Tout. In a similar way as described previously with reference to FIG. 3F, the plurality of the main series resistors absorb a portion of corresponding RF voltage swings across the terminal Tout and the corresponding gates of the main FET switches and this provides a benefit of less stringent voltage breakdown requirements for the bypass switches (e.g., S1, S2, . . . and Sn). However, this also results in a slower switching speed of the main FET switches given that the main series resistors (e.g., Rg1', Rg2', . . . and Rgn') are not bypassed. Similar tradeoff applies to a series configuration of the bypass switch block 410D and the common series resistor CRg'. In other words, a potentially high RF swing across the terminals Tin and Tout will be divided between the common series resistor CRg' and the bypass switch block 410E resulting in same performance tradeoff as just described.

Referring to FIG. 4J and proceeding from the main FET switch M1 (closest to the first node RF+ and farthest from the second node RF−) to the main FET switch Mn (closest to the second node RF− and farthest from the first node RF+), RF voltage levels experienced by the plurality of the main stacked switches (e.g., M1, M2, . . . and Mn) are in decreasing order and according to some embodiments of the disclosure. As such, the person skilled in the art will appreciate that embodiments in accordance with the present disclosure may be envisaged wherein sizes of elements coupled in series with gates of corresponding main FET switches (e.g., Si, Rgi, Rgi', i=1, 2, . . . and n) may be scaled down from top (closest to the first node RF+ and farthest from the second node RF−) to bottom (closest to the second node RF− and farthest to the first node RF+). Such embodiments provide a benefit of reducing a layout size. The person skilled in the art will further understand that, embodiments using various types of common and bypass switches (stacked or individual) implemented according to the teachings of the present disclosure, are also possible. In what follows, such embodiments are described in more detail.

Figure 4K:
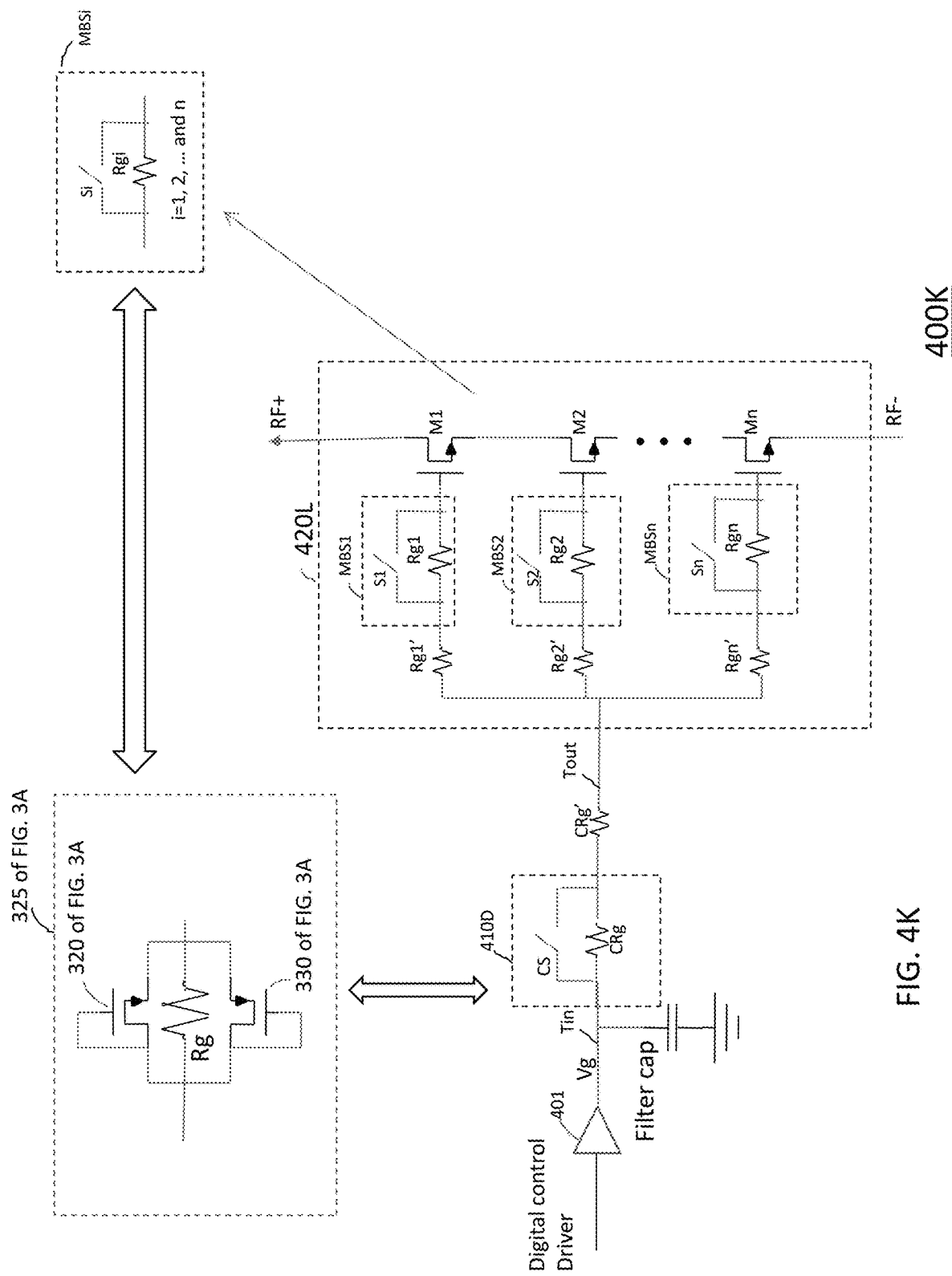
FIG. 4K shows an implementation of the switching circuit of FIG. 4J according to an embodiment of the disclosure.

FIG. 4K shows a switching circuit 400K according to another embodiment of the disclosure. Turning back to depictions of FIG. 3A and FIG. 4J, the switching circuit 400K comprises the switching circuit 400J of FIG. 4J wherein each of the one or more of the main bypass switch blocks (e.g., MBS1, MBS2, . . . and MBSn) and/or the bypass switch block 410D comprises the gate bypass switch 325 of FIG. 3A.

Figure 4L:
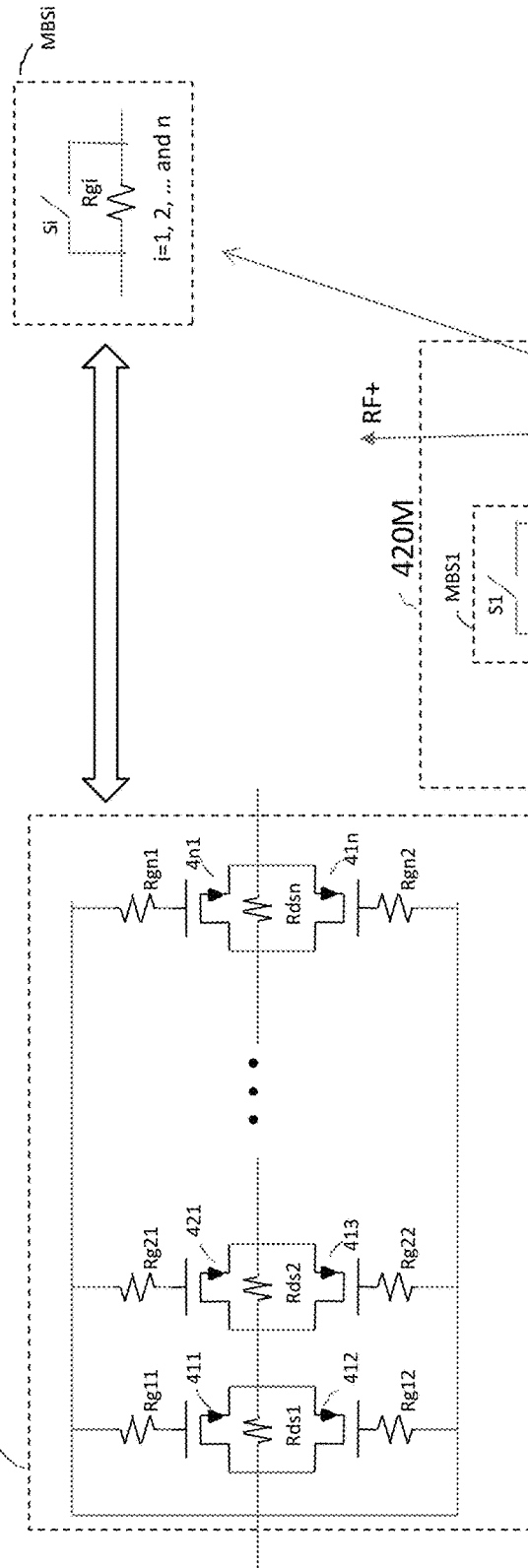
FIG. 4L shows a further implementation of the switching circuit of FIG. 4J in accordance with another embodiment of the present disclosure.
Figure 4L:
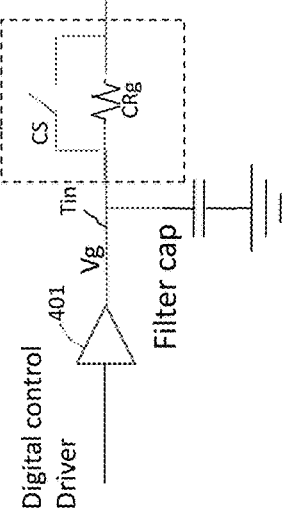

FIG. 4L shows a switching circuit 400L according to another embodiment of the disclosure. Referring back to FIG. 4A and FIG. 4J, the switching circuit 400L comprises the switching circuit 400J of FIG. 4J wherein each of the one or more bypass switch blocks (e.g., MBS1, MBS2, . . . and MBSn) as well as the bypass switch block 410E comprises the bypass FET switch stack 410A of FIG. 4A. Further referring to FIG. 4L, the person skilled in art will appreciate that various technologies in accordance with the teachings disclosed in the patents U.S. Pat. No. 6,804,502, issued on Oct. 12, 2004 and entitled "Switch circuit and method of switching Radio Frequency signals", U.S. Pat. No. 7,910,993, issued on Mar. 22, 2011 and entitled "Method and apparatus used in improving linearity of MOSFET's using an accumulated charge sink" and U.S. Pat. No. 7,248,120, issued on Jul. 24, 2007 and entitled " Stacked transistor method and apparatus") incorporated herein by reference in their entirety, to implement different switches of the switching circuit 400L are possible. By way of example, embodiments according to the disclosure may be envisaged wherein four terminal devices may be implemented when designing the first and second bypass switches as well as the main switches.

Referring back to FIG. 4J and as previously described, RF voltage levels as seen by the plurality of the main stacked switches tapper down from top to bottom. Following this trend and referring back to FIG. 4A and to FIG. 4L, the person skilled in art will appreciate that embodiments may be made wherein, proceeding from the main bypass switch block MBS1 (e.g., closest to the first node RF+ and farthest from the second node RF−) to the main bypass switch block MBSn (closest to the second node RF− and farthest from the first node RF+), the main bypass switch blocks implement a decreasing number of the stacked first bypass FET switches (e.g., bypass FET switches 411,421, . . . and 4n1) and a decreasing number of the stacked second bypass FET switches (e.g., bypass FET switches 412, 422, . . . and 41n). This will benefit applications with more stringent requirements in terms of layout size.

Figure 5A:
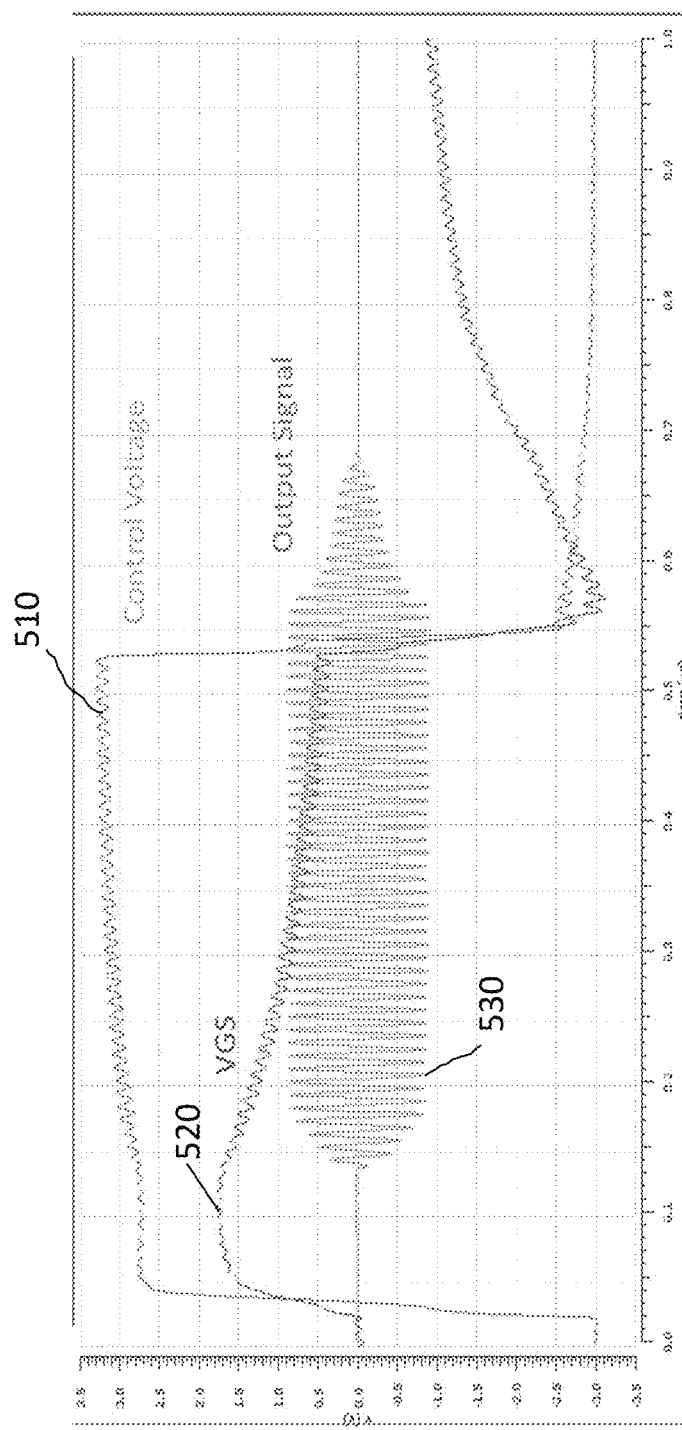
FIG. 5A shows plots of a control voltage, Vg, an output signal and a gate-source voltage, Vgs, of the bypass FET switches vs. time.
Figure 5B:
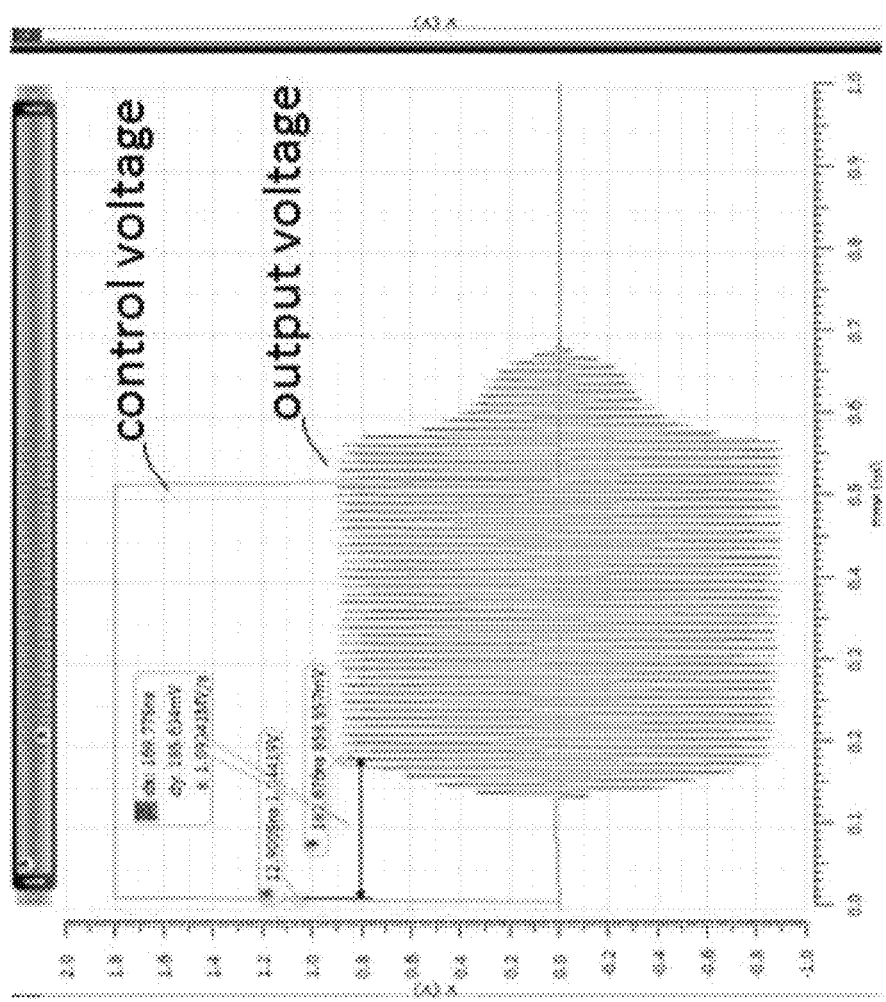
FIG. 5B shows a plot of the output signal vs. time corresponding to an embodiment in accordance of the present disclosure.
Figure 5C:
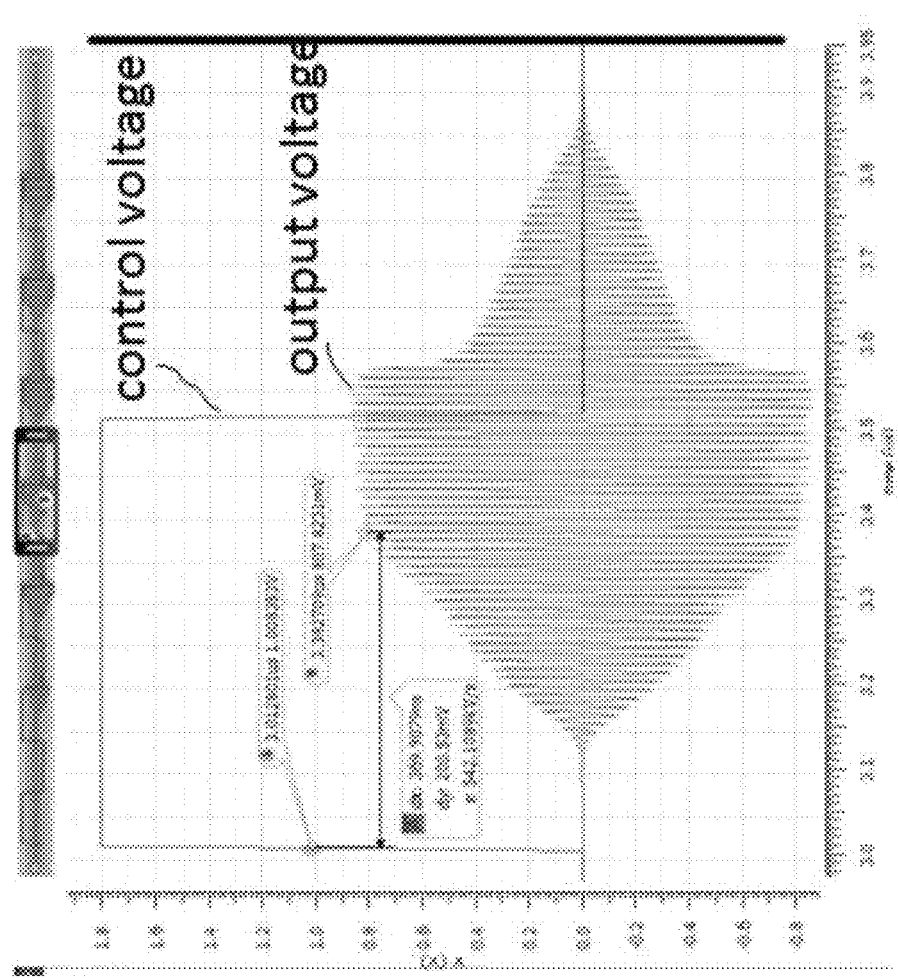
FIG. 5C shows a plot of the output signal vs. time where no bypassing has been used.

FIG. 5 shows some simulation results based on the teachings of the present disclosure and using the switching circuit of FIG. 4A. More in particular, FIG. 5A shows plots of a control voltage, Vg, an output signal and a gate-source voltage, Vgs, of the bypass FET switches vs. time. Referencing back to FIG. 4A, the output signal is the voltage appearing at the RF+ node. It has been verified in this simulation that the voltage Vgs remained always below a breakdown voltage. FIG. 5B shows a plot of the output signal vs. time corresponding to an embodiment in accordance of the present disclosure. In this plot bypassing of a gate resistor based on the teachings in the disclosure has been applied. This plot is to be compared with a plot of the output signal vs. time as shown in FIG. 5C, wherein no bypassing has been used. A much faster transition time can be noted when bypassing is used as shown in FIG. 5B.

U.S. patent application Ser. No. 14/521,378, filed on Oct. 22, 2014 and entitled "Circuit and Method for Improving ESD Tolerance and Switching Speed" and Ser. No. 14/521,331, filed on Oct. 22, 2014 and entitled "Floating Body Contact Circuit Method for Improving ESD Performance and Switching Speed", incorporated herein by reference in their entirety, disclose that during Electro Static Discharge (ESD) events, and especially when a device is unpowered, it is beneficial to have a high value gate resistor. The person skilled in the art will appreciate that the teachings of the present disclosure allow a high value gate resistor to be present in such unpowered state, while providing benefits of a lower value gate resistor during operation as described throughout the present disclosure.

Fabrication Technologies and Options

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits. Further, as should be readily apparent to one of ordinary skill in the art, various embodiments of the invention may take into account the RF characteristics (e.g., distributed effects) of various components and may include additional circuit elements to adjust or compensate for such characteristics. For example, at high radio frequencies, a pure resistor cannot be readily implemented in actual ICs—an actual resistor will have some physical length which introduces effects other than resistance alone, such as parasitic capacitance and/or inductance. Similarly, actual inductive and capacitive elements may include a resistive characteristic and also exhibit distributed effects on other components. Accordingly, where resistive R, capacitive C, and inductive L components have been specified above, it should be understood that such components may be implemented by elements that are substantially resistive, substantially capacitive, and substantially inductive, respectively.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

The invention claimed is:

1. A switching circuit comprising:
   an input terminal;
   a series arrangement of a plurality of main FET switches, and
   at least one main bypass switch block comprising:
      an NMOS FET and a PMOS FET, wherein drain terminals of the NMOS FET and the PMOS FET are connected together and source terminals of the NMOS FET and the PMOS FET are connected together;
      a main gate resistor coupled across drain-source of each of the NMOS FET and PMOS FET, the main gate resistor coupling the input terminal to a gate terminal of a corresponding main FET switch of the plurality of main FET switches, and
      an NMOS FET gate resistor and a PMOS FET gate resistor, wherein a gate terminal of the NMOS FET is coupled to the input terminal through the NMOS FET gate resistor, and a gate terminal of the PMOS FET is coupled to the input terminal through the PMOS FET gate resistor.

2. The switching circuit of claim 1 configured to receive a control voltage applied at the input terminal, the control voltage being configured to transition the plurality of the main FET switches from an OFF to an ON state and vice versa.

3. The switching circuit of claim 2, wherein the at least one main bypass switch block is configured to be open at least during a portion of a first time interval during which the plurality of the main FET switches are in the OFF or the ON state and to be closed at least during a portion of a second time interval during which the plurality of the main switches are transitioning from the OFF to the ON state and vice versa, thereby bypassing the main gate resistor.

4. A switching circuit comprising:
   an input terminal;
   a series arrangement of a plurality of main FET switches, and
   at least one main bypass switch block comprising:
      a series arrangement of a plurality of NMOS FETs;
      a series arrangement of a plurality of PMOS FETs;
      a series arrangement of a plurality of main gate resistors coupling the input terminal to a gate terminal of a corresponding main FET switch of the plurality of main FET switches;
   wherein:
      drain and source terminals of the NMOS FETs are coupled with corresponding drain and
      source terminals of the PMOS FETs respectively;
      main gate resistors of the plurality of main gate resistors are coupled across corresponding drain and source terminals of the plurality of NMOS and PMOS FETs;
      each NMOS FET of the plurality of NMOS FETs comprises an NMOS gate resistor;
      each PMOS FET of the plurality of PMOS FETs comprises a PMOS gate resistor;
      gate terminals of the plurality of NMOS FETs are coupled to the input terminal through corresponding NMOS gate resistors, and
      gate terminals of the plurality of PMOS FETs are coupled to the input terminal through corresponding PMOS gate resistors.

5. The switching circuit of claim 4 configured to receive a control voltage applied at the input terminal, the control voltage being configured to transition the plurality of the main FET switches from an OFF to an ON state and vice versa.

6. The switching circuit of claim 5, wherein the at least main bypass switch block is configured to be open at least during a portion of a first time interval during which the plurality of the main FET switches are in the OFF or the ON state and to be closed at least during a portion of a second time interval during which the plurality of the main switches are transitioning from the OFF to the ON state and vice versa, thereby bypassing the plurality of main gate resistors.

7. A switching circuit comprising:
an input terminal;
a series arrangement of a plurality of main FET switches,
a plurality of main gate resistors connected to corresponding gate terminals of the plurality of mains FET switches, the plurality of main gate resistors being tied to one another at a main gate resistors common node;
a common bypass switch block comprising:
an NMOS FET, and a PMOS FET wherein drain terminals of the NMOS FET and the PMOS FET are connected together and source terminals of the NMOS FET and the PMOS FET are connected together;
a common gate resistor coupled across drain-source of each of the NMOS FET and PMOS FET, the main gate resistor coupling the input terminal to the common main gate resistor node, and
an NMOS FET gate resistor and a PMOS FET gate resistor, wherein a gate terminal of the NMOS FET is coupled to the input terminal through the NMOS FET gate resistor, and a gate terminal of the PMOS FET is coupled to the input terminal through the PMOS FET gate resistor.

8. The switching circuit of claim 7 configured to receive a control voltage applied at the input terminal, the control voltage being configured to transition the plurality of the main FET switches from an OFF to an ON state and vice versa.

9. The switching circuit of claim 8, wherein the common bypass switch block is configured to be open at least during a portion of a first time interval during which the plurality of the main FET switches are in the OFF or the ON state and to be closed at least during a portion of a second time interval during which the plurality of the main switches are transitioning from the OFF to the ON state and vice versa, thereby bypassing the common gate resistor.

10. A switching circuit comprising:
an input terminal;
a series arrangement of a plurality of main FET switches,
a plurality of main gate resistors connected to corresponding gate terminals of the plurality of mains FET switches, the plurality of main gate resistors being tied to one another at a main gate resistors common node;
a common bypass switch block comprising:
a series arrangement of a plurality of NMOS FETs having a first NMOS FET and a second NMOS FET, the first NMOS FET being the closest to the input terminal and the second NMOS FET being the closest to the main gate resistors common node;
a series arrangement of a plurality of PMOS FETs having a first PMOS FET and a second PMOS FET, the first PMOS FET being the closest to the input terminal and the second PMOS FET being the closest to the main gate resistors common node;
a series arrangement of a plurality of bypass gate resistors coupling the input terminal to the main gate resistors common node;
wherein:
drain and source terminals of the NMOS FETs are coupled with corresponding drain and source terminals of the PMOS FETs respectively;
the plurality of main gate resistors are coupled across corresponding drain and source terminals of the plurality of NMOS and PMOS FETs;
the drain terminals of the first NMOS and PMOS FET are connected together at the input terminal, and
the source terminals of the first NMOS and PMOS FET are connected together at the main gate resistors common node.

11. The switching circuit of claim 10 configured to receive a control voltage applied at the input terminal, the control voltage being configured to transition the plurality of the main FET switches from an OFF to an ON state and vice versa.

12. The switching circuit of claim 11, wherein the common bypass switch block is configured to be open at least during a portion of a first time interval during which the plurality of the main FET switches are in the OFF or the ON state and to be closed at least during a portion of a second time interval during which the plurality of the main switches are transitioning from the OFF to the ON state and vice versa, thereby bypassing the plurality of common gate resistors.

13. A switching circuit comprising:
a series arrangement of a plurality of main FET switches, and
a plurality of main bypass switch blocks each comprising:
a main NMOS FET, and a main PMOS FET wherein drain terminals of the main NMOS FET and the main PMOS FET are connected together and source terminals of the main NMOS FET and the main PMOS FET are connected together, and
a main gate resistor coupled across drain-source of each of the main NMOS FET and main PMOS FET, the main gate resistor connected to a gate terminal of a corresponding main FET switch of the plurality of main FET switches;
a common bypass switch block comprising:
a common NMOS FET, and a common PMOS FET wherein drain terminals of the common NMOS FET and the common PMOS FET are connected together and source terminals of the common NMOS FET and the common PMOS FET are connected together, and a common gate resistor coupled across drain-source of each of the common NMOS FET and common PMOS FET, the common gate resistor coupling a control driver to the main gate resistor,
wherein the drain terminals or the source terminals of the common NMOS FETs and PMOS FETs are connected directly together at an output of the control driver.

* * * * *